US011380373B1

(12) United States Patent
Nour et al.

(10) Patent No.: US 11,380,373 B1
(45) Date of Patent: Jul. 5, 2022

(54) MEMORY WITH READ CIRCUIT FOR CURRENT-TO-VOLTAGE SLOPE CHARACTERISTIC-BASED SENSING AND METHOD

(71) Applicant: GLOBALFOUNDRIES U.S. Inc., Malta, NY (US)

(72) Inventors: Mohamed A. Nour, Ballston Spa, NY (US); Peter C. Paliwoda, Saratoga Springs, NY (US); Byoung-Woon B Min, Halfmoon, NY (US); Toshiaki Kirihata, Poughkeepsie, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/317,938

(22) Filed: May 12, 2021

(51) Int. Cl.
| | |
|---|---|
| *G11C 7/00* | (2006.01) |
| *G11C 7/06* | (2006.01) |
| *G11C 7/10* | (2006.01) |
| *G11C 8/10* | (2006.01) |
| G11C 16/04 | (2006.01) |
| G11C 11/22 | (2006.01) |

(52) U.S. Cl.
CPC ............ *G11C 7/067* (2013.01); *G11C 7/1069* (2013.01); *G11C 8/10* (2013.01); G11C 11/223 (2013.01); G11C 16/0408 (2013.01); G11C 16/0466 (2013.01); G11C 2207/063 (2013.01)

(58) Field of Classification Search
CPC ................................................. G11C 2207/063
USPC ...................................................... 365/189.15
See application file for complete search history.

(56) References Cited

U.S. PATENT DOCUMENTS

| | | |
|---|---|---|
| 8,873,303 B2 | 10/2014 | Cernea et al. |
| 9,460,760 B2 | 10/2016 | Jayaraman et al. |
| 9,779,783 B2 | 10/2017 | Anand et al. |
| | (Continued) | |

OTHER PUBLICATIONS

Hunt-Schroeder et al., "14-nm FinFET 1.5 Mb Embedded High-K Charge Trap Transistor One Time Programmable Memory Using Differential Current Sensing", IEEE Journal of Solid-State Circuits Letters, vol. 1, No. 12, 2018, pp. 233-236.

(Continued)

*Primary Examiner* — Hoai V Ho
(74) *Attorney, Agent, or Firm* — Gibb & Riley, LLC; David A. Cain, Esq.

(57) ABSTRACT

Disclosed is a memory structure including an array of memory cells and a read circuit. The read circuit includes two registers configured to capture and store two different digital-to-analog converter (DAC) codes, which correspond to two different reference currents that approximate two different output currents generated on a bitline during consecutive single-ended current sensing processes directed to the same selected memory cell but using different input voltages. Optionally, the read circuit can also include a current-voltage (I-V) slope calculator, which uses the two different DAC codes to calculate an I-V slope characteristic of the selected memory cell, and a bit generator, which performs a comparison of the I-V slope characteristic and a reference I-V slope characteristic and based on results of the comparison, generates and outputs a bit with a logic value that represents the data storage state of the selected memory cell. Also disclosed is an associated method.

20 Claims, 10 Drawing Sheets

(56) References Cited

U.S. PATENT DOCUMENTS

2019/0244661 A1* 8/2019 Kim ................... G11C 13/004
2020/0066345 A1* 2/2020 Tran ................... G11C 16/26

OTHER PUBLICATIONS

Jayaraman et al., "80-kb Logic Embedded High-K Charge Trap Transistor-Based Multi-Time-Programmable Memory With No Added Process Complexity", IEEE Journal of Solid-State Circuits, vol. 53, No. 3, 2018, pp. 949-960.
Tanzawa et al., "Design of a Sense Circuit for Low-Voltage Flash Memories", IEEE Journal of Solid State Circuits, vol. 35, No. 10, 2000, pp. 1415-1421.

* cited by examiner

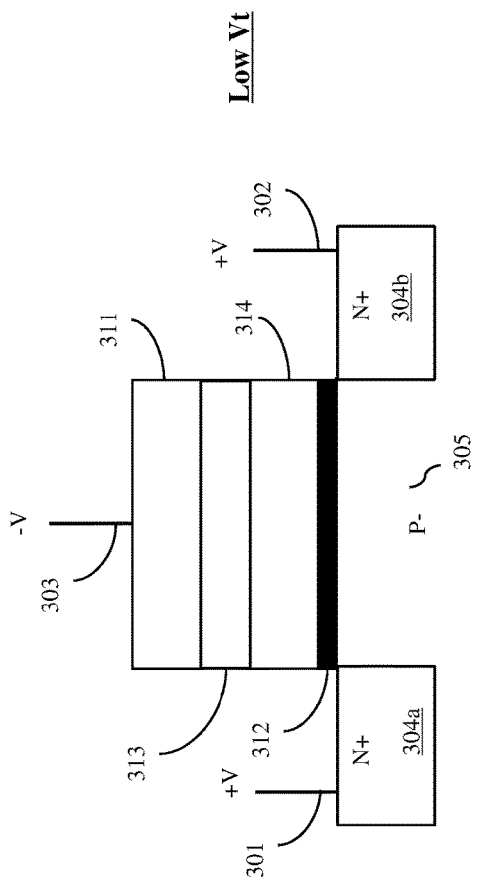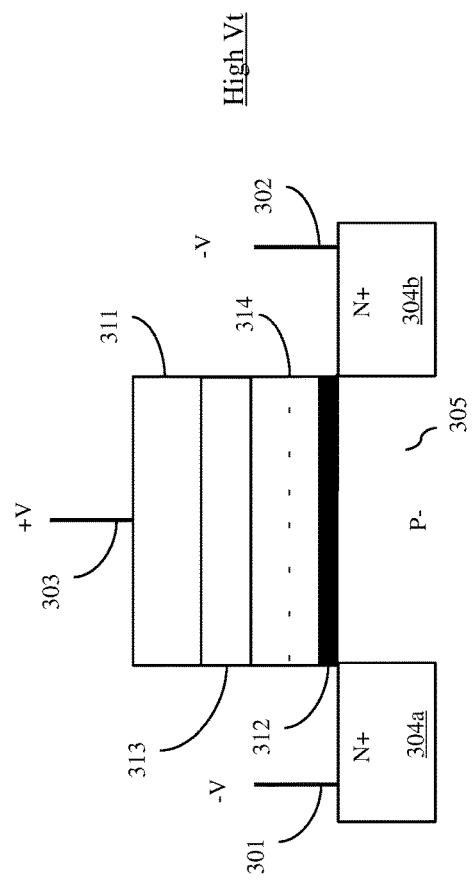
FIG. 3A
FIG. 3B (Ferroelectric Field Effect Transistor (FeFET))

(Floating Gate Field Effect Transistor (FGFET))

MEMORY WITH READ CIRCUIT FOR CURRENT-TO-VOLTAGE SLOPE CHARACTERISTIC-BASED SENSING AND METHOD

GOVERNMENT LICENSE RIGHTS

This invention was made with government support under contract P09080001334 awarded by the Defense Microelectronics Activity (DMEA). The government has certain rights in the invention.

BACKGROUND

Field of the Invention

The present invention relates to memories and, more particularly, to embodiments of a memory structure with a multi-register read circuit to facilitate current-to-voltage (I-V) slope characteristic-based detection of memory cell data storage states to reduce programming window retention loss and to embodiments of an associated method.

Description of Related Art

Some currently available memories (also referred to herein as memory structures or memory circuits) employ single-ended sensing for read operations and the single-ended sensing is typically based on the reading of a single current-to-voltage (I-V) characteristic of a memory cell. For example, a memory can include an array of memory cells arranged in columns and rows, bitlines for the columns, and wordlines for the rows. All memory cells in the same column can be connected to the bitline for that column. All the memory cells in the same row can be connected to the wordline for that row. A read operation can be directed to a selected memory cell located at a specific column and a specific row within the array. During the read operation, a specific wordline for the specific row can be driven to a positive voltage level (also referred to herein as the wordline voltage (Vw) or gate voltage (Vg)). Then, an output current (Io) (also referred to herein as a read current (Iread) or drain current (Id)), which is detectable on the specific bitline for the specific column, can be compared to a reference current (Iref) by a current sense amplifier (CSA). In these memories, if Io is below Iref, then an output signal (Q) from the CSA will be indicative of a stored bit with a first logic value (e.g., a "1"), whereas if Io is above Iref, then Q from the CSA will be indicative of a stored bit with a second logic value (e.g., a "0"). The difference between Io for a "1" and Io for a "0" at a given Vg is referred to herein as the programming window (PW) and Iref is typically set at approximately the midpoint of the PW. However, over time and/or with higher operating temperatures the PW may become smaller (i.e., the range between Io for a "1" and Io for a "0" at the given Vg may be reduced). The term programming window retention loss ($RL_{PW}$) refers to the amount by which the PW is reduced over time and, as $RL_{PW}$ becomes larger, the likelihood of read fails increases. Thus, there is a need in the art for a memory structure designed to minimize time and/or temperature dependent $RL_{PW}$ and, thereby minimize read fails.

SUMMARY

Disclosed herein are embodiments of a memory structure that includes an array of memory cells and a read circuit, which is configured to facilitate detection of a data storage state of any memory cell in the array based on a current-to-voltage slope characteristic of the memory cell. The read circuit can include a current sense amplifier with a data input node, a reference input node, and an output node. The read circuit can further include a column decoder connected between the array and the data input node. The read circuit can further include a digital-to-analog converter connected to the reference input node. The read circuit can further include multiple registers and, particularly, two different registers, which are each connected to the output node of the current sense amplifier and which are controlled by different clock signals. As discussed further in the detailed description section such a read circuit configuration allows the results of two consecutive single-ended current sensing processes, which are directed to the same selected memory cell but employ different input voltages, to be captured and stored in the registers. Processing elements within or outside the read circuit can then calculate a current-voltage (I-V) slope characteristic for the selected memory cell using the results stored in the registers, can perform a comparison of the I-V slope characteristic to a reference I-V slope characteristic, and can generate and output a bit indicative of the data storage state of the selected memory cell based on the comparison.

Also disclosed herein are embodiments of a memory structure that includes an array of memory cells and a read circuit, which is specifically configured to detect a data storage state of any memory cell in the array based on a current-to-voltage slope characteristic of the memory cell and to generate and output a bit representative of that data storage state. For example, in these embodiments, the read circuit can include a current sense amplifier with a data input node, a reference input node and an output node. The read circuit can further include a column decoder connected between the array and the data input node. The read circuit can further include a digital-to-analog converter connected to the reference input node. The read circuit can further include multiple registers and, particularly, two different registers, which are each connected to the output node of the current sense amplifier and which are controlled by different clock signals. As discussed above, such a read circuit configuration allows the results of two consecutive single-ended current sensing processes, which are directed to the same selected memory cell but employ different input voltages, to be captured and stored in the registers. In these embodiments, the read circuit can further include both a current-voltage (I-V) slope calculator, which is configured to calculate a current-voltage (I-V) slope characteristic for the selected memory cell using the results stored in the registers, and a bit generator, which is configured to perform a comparison of the I-V slope characteristic to a reference I-V slope characteristic and to generate and output a bit indicative of the data storage state of the selected memory cell based on the comparison.

It should be noted that the above-mentioned I-V slope characteristic will vary depending upon the types of input voltages used the single-ended current sensing processes. That is, the I-V slope characteristic will be mutual conductance (Gm) when the different input voltages are different gate voltages. However, the I-V slope characteristic will be conductance (G) when the different input voltages are different drain voltages.

Also disclosed herein are method embodiments associated with the above-described memory structures. The method can include providing a memory structure with an array of memory cells and a read circuit connected to the array. The method can further include detecting, by the read circuit, a data storage state of any memory cell in the array based on a current-to-voltage (I-V) slope characteristic of that memory cell. Specifically, the method can include determining, by the read circuit, an I-V slope characteristic for a memory cell based on the results of two discrete single-ended current sensing processes at two different input voltages, respectively. In some embodiments, the I-V slope characteristic can be mutual conductance (Gm) and the different input voltages used during the discrete single-ended current sensing processes can be different gate voltages. In other embodiments, the I-V slope characteristic can be conductance (G) and the different input voltages used during the discrete single-ended current sensing processes can be different drain voltages. The method can further include performing, by the read circuit, a comparison of the I-V slope characteristic and a reference I-V slope characteristic to detect the data storage state of the memory cell and outputting, by the read circuit, a bit representative of the data storage state based on the results of the comparison.

In the above-described memory structure and method embodiments, the data storage state of a memory cell can be detected by determining an I-V slope characteristic (e.g., Gm or G) of the memory cell and comparing it to a reference I-V slope characteristic. By comparing an I-V slope characteristic for a memory cell (which is acquired through two consecutive single-ended current sensing processes using two different input voltages, respectively) to a reference I-V slope characteristic to detect the data storage state of the memory cell as opposed to comparing a single output current characteristic (which is acquired through a single single-ended current sensing process) to a reference output current characteristic, the above-described memory structure and method embodiments can significantly reduce retention loss of the memory cell programming window (PW) over time and with increased operating temperatures.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 3A and 3B are cross-section diagrams illustrating different programming states of a charge trap field effect transistor (CTFET);

DETAILED DESCRIPTION

Figure 1:
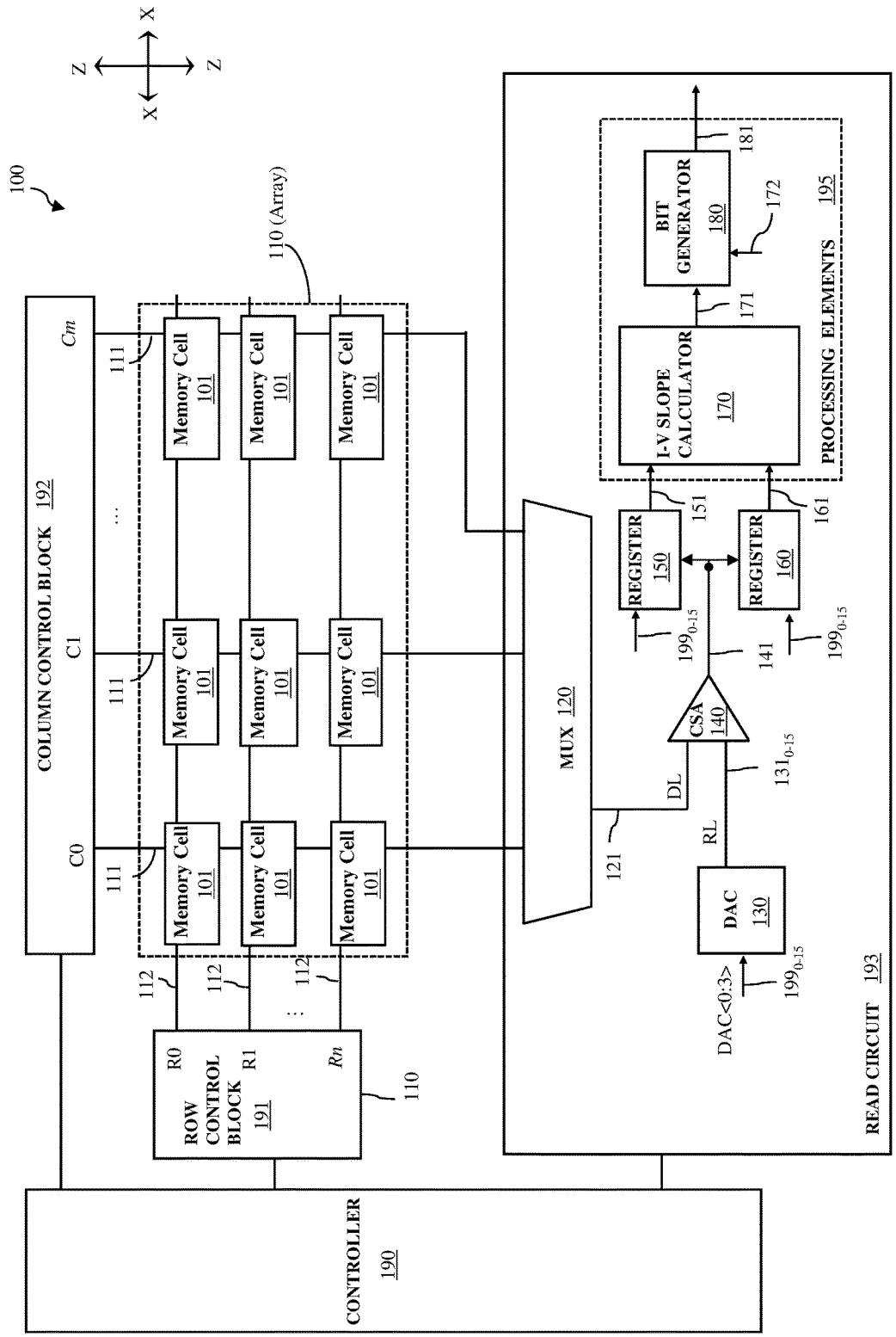
FIG. 1 is a schematic diagram illustrating embodiments of a memory structure.

As mentioned above, some currently available memories (also referred to herein as memory structures or memory circuits) employ single-ended sensing for read operations and the single-ended sensing is typically based on the reading of a single current-to-voltage (I-V) characteristic of a memory cell. For example, a memory can include an array of memory cells arranged in columns and rows, bitlines for the columns, and wordlines for the rows. All memory cells in the same column can be connected to the bitline for that column. All the memory cells in the same row can be connected to the wordline for that row. A read operation can be directed to a selected memory cell located at a specific column and a specific row within the array. During the read operation, a specific wordline for the specific row can be driven to a specific positive voltage level (also referred to herein as the wordline voltage (Vw) or gate voltage (Vg)). Then, an output current (Io) (also referred to herein as a read current (Tread) or drain current (Id)), which is detectable on the specific bitline for the specific column, can be compared to a reference current (Tref) by a current sense amplifier (CSA). In these memories, if Io is below Iref, then an output signal (Q) from the CSA will be indicative of a stored bit with a first logic value (e.g., a "1"), whereas if Io is above Tref, then Q from the CSA will be indicative of a stored bit with a second logic value (e.g., a "0"). The difference between Io for a "1" and Io for a "0" at a given Vg is referred to herein as the programming window (PW) and Tref is typically set at approximately the midpoint of the PW. However, over time and/or with higher operating temperatures the PW may become smaller (i.e., the range between Io for a "1" and Io for a "0" at the given Vg may be reduced). The term programming window retention loss ($RL_{PW}$) refers to the amount by which the PW is reduced over time and can be determined using the following equation:

$$RL_{PW}\% = 100*(PW_{T0}-PW_{EOL})/PW_{T0}, \tag{1}$$

where $PW_{T0}$ is the PW at time 0 (T0), where $PW_{EOL}$ is the PW at the end of life (EOL). Additionally, $RL_{PW}$ % can increase significantly with an increase in operating temperature. For example, in existing memory structures, the $RL_{PW}$ % can be as high as 35% or even higher when the operating temperature is 85° C. and can be as high as 65% or even higher when the operating temperature is raised to 125° C. Unfortunately, when the PW is relatively small, as the $RL_{PW}$ % increases so does the likelihood of read fails. For example, for memory cells that start off with a relatively small PW of, for example 0.0002 A or smaller, time and/or temperature dependent reductions in the PW (i.e., time and/or temperature dependent increases in $RL_{PW}$ %) can make detection of the current differential (i.e., the difference between Io and Iref) difficult and can result in a significant increase in read fails. Thus, there is a need in the art for a memory structure designed to minimize time and/or temperature dependent $RL_{PW}$ and, thereby minimize read fails.

In view of the foregoing, disclosed herein are embodiments of a memory structure that includes an array of memory cells and a read circuit, which is configured to at least facilitate detection of a data storage state of any memory cell in the array based on a current-to-voltage slope characteristic of the memory cell. The read circuit can include a current sense amplifier with a data input node, a reference input node, and an output node. The read circuit can further include a column decoder connected between the array and the data input node. The read circuit can further include a digital-to-analog converter connected to the reference input node. The read circuit can further include multiple registers and, particularly, two different registers, which are each connected to the output node of the current sense amplifier and which are controlled by different clock signals. Such a read circuit configuration allows the results of two consecutive single-ended current sensing processes, which are directed to the same selected memory cell but employ different input voltages, to be captured and stored in the registers. Processing elements within or outside the read circuit can then calculate a current-voltage (I-V) slope characteristic for the selected memory cell (e.g., mutual conductance (Gm) or conductance (G) of the selected memory cell depending upon the type of input voltages) using the results stored in the registers, can perform a comparison of the I-V slope characteristic to a reference I-V slope characteristic, and can generate and output a bit indicative of the data storage state of the selected memory cell based on the comparison. Also disclosed herein are embodiments of an associated method for sensing the data storage states of memory cells in a memory array using I-V slope characteristics. It should be noted that by comparing an I-V slope characteristic for a memory cell (which is acquired through two consecutive single-ended current sensing processes using two different input voltages, respectively) to a reference I-V slope characteristic to detect the data storage state of the memory cell as opposed to comparing a single output current characteristic (which is acquired through a single single-ended current sensing process) to a reference current characteristic, the disclosed memory structure and method embodiments can significantly reduce retention loss of the memory cell programming window (PW) over time and with increased operating temperatures.

More particularly, referring to FIG. 1, disclosed herein are embodiments of a memory structure 100. The memory structure 100 can include an array 110 of memory cells 101.

The memory cells 101 within the array 110 can be arranged in columns (e.g., see columns C0-Cm) and rows (e.g., see rows R0-Rn). For purposes of illustration, the columns are shown on the drawing sheet as being oriented in the Z-direction (i.e., from the top of the sheet toward the bottom) and the rows are shown on the sheet as being oriented in the X-direction (i.e., from the left-side of the sheet to the right-side). The orientation of the columns and rows of the memory cells as shown in the figures is not intended to be limiting. Alternatively, the columns could be oriented in the X-direction and the rows could be oriented in the Z-direction. In any case, the columns can be essentially perpendicular to the rows with each memory cell 101 being at an intersection between one column and one row.

The memory structure 100 can further include bitlines 111 for the columns C0-Cm, respectively, and wordlines 112 for the rows R0-Rn, respectively. All memory cells 101 in each column can be electrically connected to the bitline 111 for that column. All memory cells 101 in each row can be electrically connected to the wordline 112 for that row.

Figure 2A:
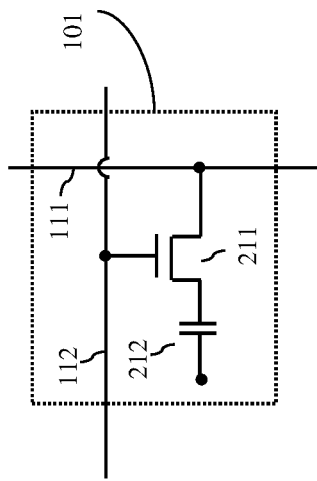
FIGS. 2A and 2B are circuit diagrams illustrating different types of memory cells, respectively, that can be incorporated in the memory structure of FIG. 1.

In some embodiments, the memory cells 101 can be threshold voltage (Vt)-programmable field effect transistor-type memory cells, as illustrated in FIG. 2A. A Vt-programmable FET 201 can include a gate, which is electrically connected to the wordline 112 for the row containing the memory cell, a drain region, which is connected to a bitline 111 for the column containing the memory cell, and a source region. Depending upon the type of Vt-programmable FET and whether the memory structure is configured as a one-time programmable memory (OTPM) or a multi-time programmable memory (MTPM), the source region can be electrically connected directly to a ground rail or to a source line for a column for application of either a negative voltage (V−) or a positive voltage (V+) to the source region. In any case, the gate of such a device can be configured to that the threshold voltage (Vt) can be selectively programmed (i.e., changed) and, more particularly, so that the Vt can be switched between a low Vt state and a high Vt state. Thus, the gate can effectively function as a data storage node 202. A low Vt can be the first data storage state (also referred to herein as an unprogrammed state), which represents a first stored data value (e.g., a logic value of "0"). A high Vt can be the second data storage state (also referred to herein as a programmed state), which represents a second stored data value (e.g., a logic value of "1"). Exemplary Vt-programmable FETs 201 include, but are not limited to, charge trap field effect transistors (CTFETs) (as shown in FIGS. 3A-3B), ferroelectric field effect transistors (FeFETs) (as shown in FIGS. 4A-4B), and floating gate field effect transistors (FGFETs) (as shown in FIGS. 5A-5B).

Referring to FIGS. 3A-3B, a CTFET can include N+ source/drain regions 304a-304b (i.e., first and second terminals 301-302) and a channel region 305 (e.g., a P− channel region) positioned between the N+ source/drain regions 304a-304b. The CTFET can further include a gate (i.e., a third terminal 303) adjacent to the channel region 305. The gate can be a multi-layered structure including, for example, a gate dielectric layer 312 on the channel region 305, a charge trap layer 314 (e.g., a silicon nitride layer) on the gate dielectric layer 312, another gate dielectric layer 313 on the charge trap layer 314 and a control gate layer 311 (e.g., a metal gate layer) on the gate dielectric layer 313. The gate can be selectively programmed so that the CTFET has either a low Vt or a high Vt. To selectively program the gate so that the CTFET has a high Vt, a positive voltage pulse (e.g., VDD) can be applied to the gate and a negative voltage pulse can be applied to the N+ source/drain regions 304a-304b. This results in electrons moving into the charge trap layer 314, thereby increasing the Vt of the device (see FIG. 3B). To selectively program the gate so that the CTFET has a low Vt, a negative voltage pulse can be applied to the gate and a positive voltage pulse (e.g., VDD) can be applied to the N+ source/drain regions 304a-304b. This results in electrons moving out of the charge trap layer 314, thereby decreasing the Vt of the device (see FIG. 3A).

Figure 4A:
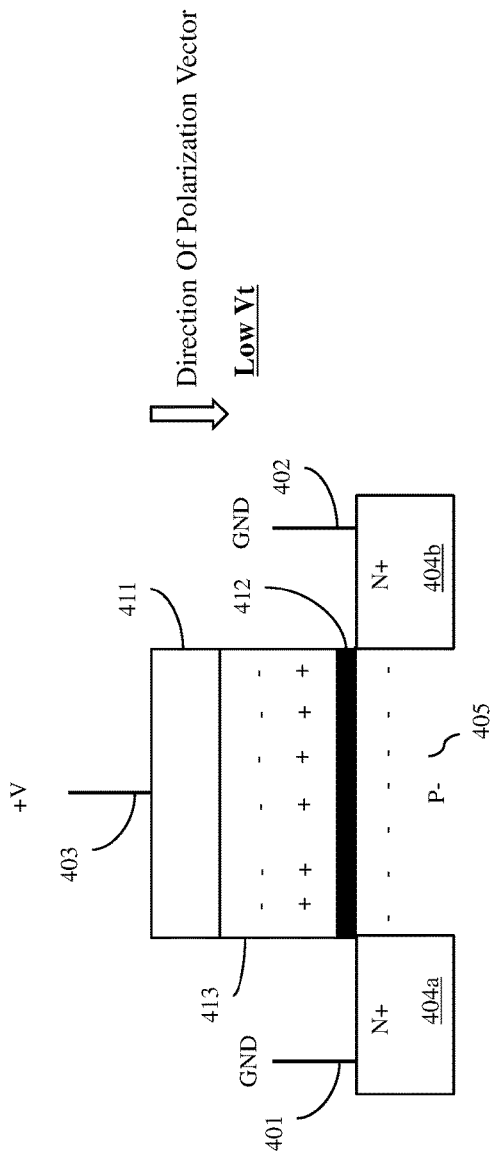
FIGS. 4A and 4B are cross-section diagrams illustrating different programming states of a ferroelectric field effect transistor (FeFET)
Figure 4B:
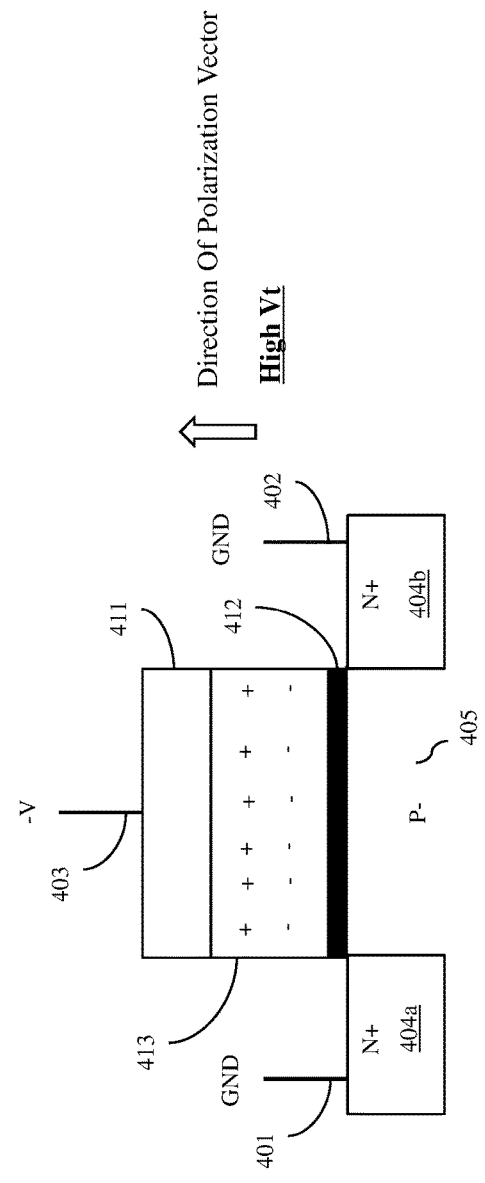

Referring to FIGS. 4A-4B, an FeFET can include N+ source/drain regions 404a-2404b (i.e., first and second terminals 401-402) and a channel region 405 (e.g., a P− channel region) positioned between the N+ source/drain regions 404a-404b. The FeFET can further include a gate (i.e., a third terminal 403) adjacent to the channel region 405. This gate can be a multi-layered structure including, for example, a gate dielectric layer 412 on the channel region 405, a ferroelectric layer 413 (e.g., a hafnium oxide layer or some other suitable ferroelectric layer) on the gate dielectric layer 412, and a control gate layer 411 (e.g., a metal gate layer) on the ferroelectric layer 413. The gate can be selectively programmed so that the FeFET has either a low Vt or a high Vt. To selectively program the gate so that the FeFET has a low Vt, a positive voltage pulse (e.g., VDD) could be applied to the gate and 0 volts could be applied to the N+ source/drain regions 404a-404b (e.g., the N+ source/drain regions 404a-404b could be discharged to ground). This results in the direction of polarization vector of the ferroelectric layer 413 pointing toward the channel region 405 (i.e., it results in + poles of di-poles in the layer 413 being adjacent to the channel region 405 and − poles of the dipoles being adjacent to the control gate layer 411) such that electrons are attracted to the channel region 405, thereby creating a conductive region in the channel region 405 between the N+ source/drain regions 404a-404b (see FIG. 4A). To selectively program the gate so that the FeFET has a high Vt, a negative voltage pulse can be applied to the gate and 0 volts can be applied to the N+ source/drain regions 404a-404b (e.g., again discharging the N+ source/drain regions 404a-404b to ground). This results in the direction of polarization vector of the ferroelectric layer 413 pointing toward the control gate layer 411 (i.e., it results in + poles of di-poles in the layer 413 being adjacent to the control gate layer 411 and − poles of the dipoles being adjacent to the channel region 405) such that electrons are repelled from channel region 405, thereby eliminating any conductive region between the N+ source/drain regions 404a-404b (see FIG. 4B).

Figure 5A:
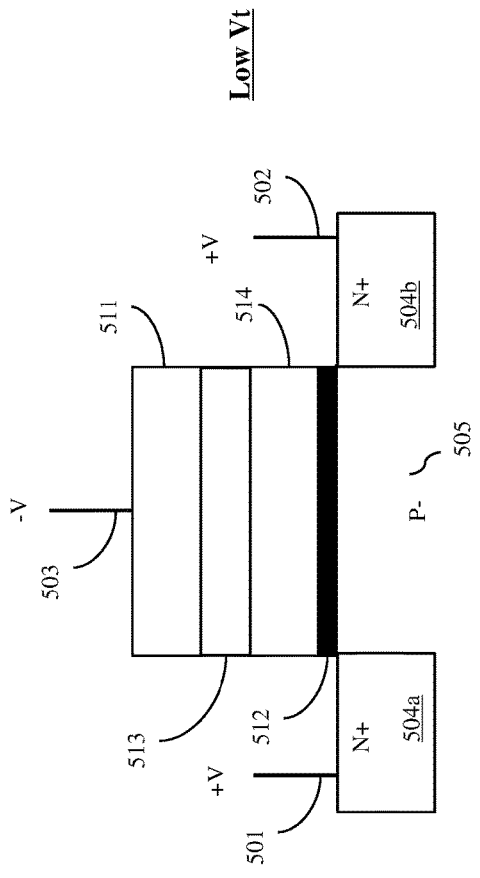
FIGS. 5A and 5B are cross-section diagrams illustrating different programming states of floating gate field effect transistor (FGFET)
Figure 5B:
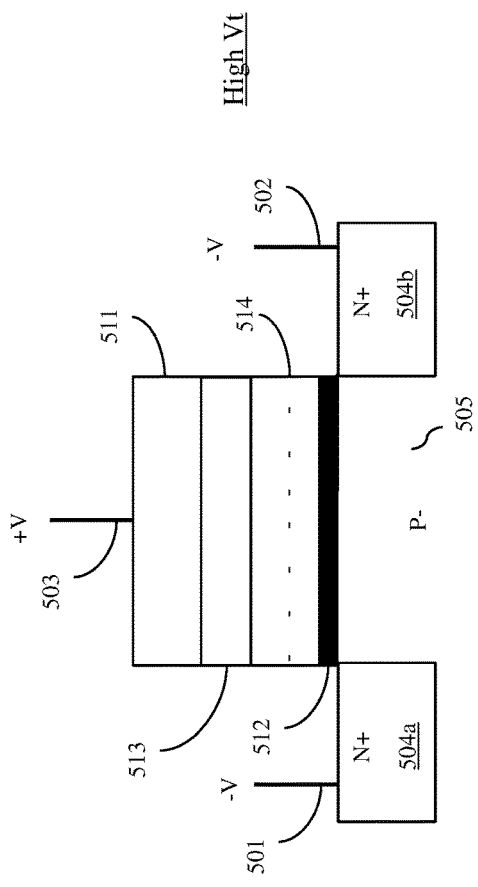

Referring to FIGS. 5A-5B, an FGFET can include N+ source/drain regions 504a-504b (i.e., first and second terminals 501-502) and a channel region 505 (e.g., a P−channel region) positioned between the N+ source/drain regions 504a-504b. The FGFET can further include a gate (i.e., a third terminal 503) adjacent to the channel region 505. The gate can be a multi-layered structure including, for example, a gate dielectric layer 512 on the channel region 505, a floating gate layer 514 (e.g., a polysilicon layer) on the gate dielectric layer 512, another gate dielectric layer 513 on the floating gate layer 514 and a control gate layer 511 (e.g., a metal gate layer) on the gate dielectric layer 513. The gate can be selectively programmed so that the FGFET has either a low Vt or a high Vt. For example, to program the gate so that the FGFET has a high Vt, a positive voltage pulse (e.g., VDD) can be applied to the gate and a negative voltage pulse can be applied to the N+ source/drain regions 504a-504b. This results in electrons moving into the floating gate layer 514 increasing the Vt of the device (see FIG. 5B). To selectively program the gate so that the FGFET has a low Vt, a negative voltage pulse can be applied to the gate and a positive voltage pulse (e.g., VDD) can be applied to the N+ source/drain regions 504a-504b. This results in electrons moving out of the floating gate layer 514 decreasing the Vt of the device (see FIG. 5A).

Figure 2B:
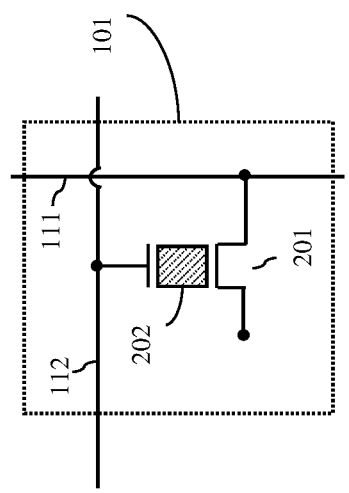

In other embodiments, the memory cells 101 can be dynamic random access memory (DRAM) cells, as illustrated in FIG. 2B. An exemplary DRAM cell can include, for example, an N-type access transistor 211 and a storage capacitor 212. The N-type access transistor 211 can have a gate connected to a wordline for a row containing the memory cell, a drain region connected to a bitline for a column containing the memory cell, and a source region connected to the storage capacitor 212. The storage capacitor 212 can have a dielectric layer between a first conductive plate, which is connected to a ground rail, and a second conductive plate, which is connected to the N-type access transistor 211.

In still other embodiments, the memory cells 101 could be any other type of memory cell where the data storage state is typically read out using a single-ended sensing process.

It should be noted that, to avoid clutter in the figures and to allow the reader to focus on the salient aspect of the disclosed embodiments particularly related to the read circuit 193 (discussed in greater detail below), supply voltage connections to the memory cells are not shown in FIG. 1 and such connections may vary depending upon the type of memory cell. For example, for FeFET-type memory cells, the source region of each FET can be connected to a ground rail because Vt programming of a FeFET simply requires the source/drain regions to be discharged to ground while V− or V+ is applied to the gate. For DRAM-type memory cells, one conductive plate of the capacitor in each DRAM can be connected to a ground rail. For CTFET and FGFET-type memory cells, the source region of each FET in each column can be connected to a source line for the column to enable selective application of V− or V+ to the source/drain regions during Vt programming.

Referring again to FIG. 1, the memory structure 100 can further include a controller 190 and peripheral circuitry 191-193 in communication with the controller 190, connected to the array and configured to facilitate memory cell operations (e.g., write and read) in response to control signals from the controller 190. The peripheral circuitry can include a row control block 191, which is electrically connected to the WLs 112 for the rows, and which includes, for example, address decode logic and wordline drivers for appropriately biasing specific wordlines depending upon the mode of operation. The peripheral circuitry can also include a column control block 192, which is electrically connected to bitlines 111 for the columns (and, if applicable, to source lines for the columns) and which includes, for example, column address decode logic and bitline drivers (and, if applicable, source line drivers) for appropriately biasing specific bitlines (and, if applicable, specific source lines) depending upon the mode of operation. The peripheral circuitry also includes a read circuit 193 that is connected to the array 110 and that enables detecting of the data storage state of any selected memory cell 101 located at a specific column and a specific row in the array 110.

In the embodiments of the memory structure 100 disclosed herein, the read circuit 193 can be configured to facilitate the detection of the data storage state of any selected memory cell 101 in the array 110 based, not on a single output current characteristic of the selected memory cell from a single single-ended current sensing process, but rather based on a current-to-voltage (I-V) slope characteristic of the selected memory cell. Specifically, the read circuit 193 can be configured to capture and store the results from two discrete single-ended current sensing processes directed to the same selected memory cell but using different input voltages. Once the results have been captured and stored, processing elements 195 (e.g., a current-voltage (I-V) slope calculator 170 and a bit generator 180) that are within the read circuit 193, as illustrated, or optionally outside the read circuit 193 (e.g., in the controller 190) or even outside the memory structure 100 can then calculate a current-voltage (I-V) slope characteristic for the selected memory cell (e.g., mutual conductance (Gm) or conductance (G) of the selected memory cell depending upon the type of input voltage used) using the results stored in the registers, can perform a comparison of the I-V slope characteristic to a reference I-V slope characteristic, and can generate and output a bit indicative of the data storage state of the selected memory cell based on the comparison.

For purposes of this disclosure, an I-V slope characteristic refers to the ratio of the difference between two different output currents ($Io_1$ and $Io_2$) (also referred to herein as read currents (Treads) or drain currents (Ids)) to a difference between two different input voltages ($Vi_1$ and $Vi_2$). For different types of I-V slope characteristics, the types of input voltages used for this ratio will vary.

For example, one exemplary I-V slope characteristic that could be employed for data storage state detection by the read circuit 193 is mutual conductance (Gm) (also referred to herein as the Io-Vg slope characteristic). For purposes of this disclosure, the mutual conductance (Gm) refers to the ratio of the difference between two different output currents ($Io_1$ and $Io_2$) (also referred to herein as read currents (Ireads) or drain currents (Ids)) to a difference between two different input voltages ($Vi_1$ and $Vi_2$) and, particularly, to a difference between two different gate voltages (also referred to herein as wordline voltages (Vws)), where $Vg_1$ and $Vg_2$ are applied to the specific wordline for the specific row containing the selected memory cell and thereby to the gate of the FET in the selected memory cell during two discrete single-ended current sensing processes, respectively, and where $Io_1$ and $Io_2$ are detectable on the specific bitline for the specific column containing the selected memory cell in response to $Vg_1$ and $Vg_2$, respectively. That is, $$Gm=\partial Io/\partial Vg, \text{ or} \qquad (2)$$

$$Gm=(Io_2-Io_1)/(Vg_2-Vg_1), \qquad (3)$$

where $Vg_1$ and $Io_1$ are associated with the first single-ended current sensing process and refer to the first gate voltage applied to the specific wordline for the specific row containing the selected memory cell and to the first output current sensed on the specific bitline for the specific column containing the selected memory cell in response to $Vg_1$ and where $Vg_2$ and 102 are associated with the second single-ended current sensing process and refer to the second gate voltage applied to the specific wordline and the second output current sensed on the specific bitline in response to $Vg_2$. In Gm-based sensing, the drain voltage (Vd) of the FET of the selected memory cell would be maintained at the same level (e.g., via the specific bitline for the specific column containing the selected memory cell) during both single-ended current sensing processes.

Generally, for a Gm-based sensing, the controller 190 will cause the two discrete single-ended current sensing processes to be performed (i.e., the first single-ended current sensing process and the second single-ended current sensing process) one immediately after the other. For the first single-ended current sensing process, the controller 190 can cause the row control block 191 to apply the first gate voltage ($Vg_1$) to the specific wordline 112 for the specific row containing the selected memory cell 101 (and thereby to the gate of the FET of the selected memory cell 101), can cause the drain voltage of the FET of the selected memory cell 101 to be maintained at some set level (Vd) (e.g., via the specific bitline 11 for the specific column containing the selected memory cell), and can cause the read circuit 193 to detect the first output current ($Io_1$) in response to the first gate voltage ($Vg_1$). For the second single-ended current sensing process, the controller 190 can cause these same processes to be repeated for a different gate voltage. That is, the controller 190 can cause the row control block 191 to apply a second gate voltage ($Vg_2$) to the specific wordline 112 (and thereby to the gate of the FET of the selected memory cell), can cause the drain voltage of the FET of the selected memory cell 101 to again be maintained at Vd (e.g., via the specific bitline 111), and can cause the read circuit 193 to detect a second output current ($Io_2$) in response to the second gate voltage ($Vg_2$). The read circuit 193 can further be configured capture and store digital values and, particularly, digital-to-analog converter (DAC) codes corresponding to reference current that approximate $Io_1$ and $Io_2$. These digital values can subsequently be used by processing elements 195 within or outside the read circuit to calculate a Gm value (which is an I-Vg slope value) for the selected memory cell using the above-mentioned Gm equation, to perform a comparison of the Gm value to a reference Gm value (which is typically at a mid-point with the Gm PW), and to output a bit that is representative of the data storage state of the selected memory cell 101 given the results of the comparison. For example, the bit could have a first logic value (e.g., a logic value of "1") when the Gm value is less than or equal to the reference Gm value and a second logic value (e.g., a logic value of "0") when the Gm value is greater than the reference Gm value.

Another exemplary I-V slope characteristic that could be employed for data storage state detection by the read circuit 193 is conductance (G) (also referred to herein as the Io-Vd slope characteristic). For purposes of this disclosure, the conductance (G) refers to the ratio of the difference between two different output currents ($Io_1$ and $Io_2$) (also referred to herein as read currents (Ireads) or drain currents (Ids)) to a difference between two different input voltages ($Vi_1$ and $Vi_2$), and, particularly, a difference between two different drain voltages ($Vd_1$ and $Vd_2$), where $Vd_1$ and $Vd_2$ are different drain voltage levels maintained at the drain of the FET of the selected memory cell during the two discrete single-ended current sensing processes, respectively, and where $Io_1$ and $Io_2$ are detectable on the specific bitline for the specific column containing selected memory cell in response to $Vd_1$ and $Vd_2$, respectively. That is, $$G=\partial Io/\partial Vd, \text{ or} \qquad (4)$$

$$G=(Io_2-Io_1)/(Vd_2-Vd_1), \qquad (5)$$

where $Vd_1$ and $Io_1$ are associated with the first single-ended current sensing process and refer to the first drain voltage and the first output current sensed on the specific bitline for the specific column containing the selected memory cell in response to $Vd_1$ and where $Vd_2$ and $Io_2$ are associated with the second single-ended current sensing process and refer to the second drain voltage and the second output current sensed on the specific bitline in response to $Vd_2$. In G-based sensing, during both the first single-ended current sensing process and the second single-ended current sensing process, the same gate voltage (Vg) is applied to the specific wordline for the specific row containing the selected memory cell and thereby to the gate of the FET of the selected memory cell.

Generally, for a G-based sensing, the controller 190 will cause the two discrete single-ended current sensing processes to be performed (i.e., the first single-ended current sensing process and the second single-ended current sensing process) one immediately after the other. For the first single-ended current sensing process, the controller 190 can cause the row control block 191 to apply a gate voltage (Vg) to the specific wordline 112 for the specific row containing the selected memory cell 101 (and thereby to the gate of the FET of the selected memory cell), can cause a first drain voltage ($Vd_1$) to be maintained on the drain of the FET (via the specific bitline 111 for the specific column containing the selected memory cell 101), and can cause the read circuit 193 to detect the first output current ($Io_1$) in response to the first drain voltage ($Vd_1$). For the second single-ended current sensing process, the controller 190 can cause these same processes to be repeated for a different drain voltage. That is, the controller 190 can cause the row control block 191 to apply the same gate voltage (Vg) to the specific wordline 112 (and thereby to the gate of the FET of the selected memory cell), can cause a second drain voltage ($Vd_2$) to be maintained on the drain of the cell FET (e.g., via the specific bitline 111), and can cause the read circuit 193 to detect a second output current ($Io_2$) in response to the second drain voltage (Vd$_2$). Again, the read circuit 193 can be configured capture and store digital values and, particularly, digital-to-analog converter (DAC) codes corresponding to reference current that approximate Io$_1$ and Io$_2$. These digital values can subsequently be used by processing elements 195 within or outside the read circuit to calculate a G value (which is an I-Vd slope value) for the selected memory cell 101 using the above-mentioned G equation, to perform a comparison of the G value to a reference G value (which is typically at a mid-point with the G PW), and to output a bit that is representative of the data storage state of the selected memory cell given the results of the comparison. For example, the bit could have a first logic value (e.g., a logic value of "1") when the G value is less than or equal to the reference G value and a second logic value (e.g., a logic value of "0") when the G value is greater than the reference G value.

More specifically, the read circuit 193 can include, for example, a column decoder 120, a digital-to-analog converter (DAC) 130, a current sense amplifier (CSA) 140, a pair of registers (including a first register 150 associated with the first input voltage (Vi$_1$) and a second register 160 associated with the second input voltage (Vi$_2$)), a current-voltage (I-V) slope calculator 170, and a bit generator 180.

The column decoder 120 can include, for example, column address decode logic and a multiplexor (MUX). The column decoder 120 can have multiple inputs and each input can be connected to a corresponding one of the bitlines 111 for multiple columns. The column decoder 120 can further have a single output connected to a data line (DL). The column decoder 120 can be configured to selectively connect a specific bitline for a specific column to the DL during a read operation directed to a selected memory cell 101 in the array and located in the specific column and at a specific row. Such column decoders 120 are well known in the art and, thus, the details thereof have been omitted from the specification to allow the reader to focus on the salient aspects of the disclosed embodiments.

Figure 6:
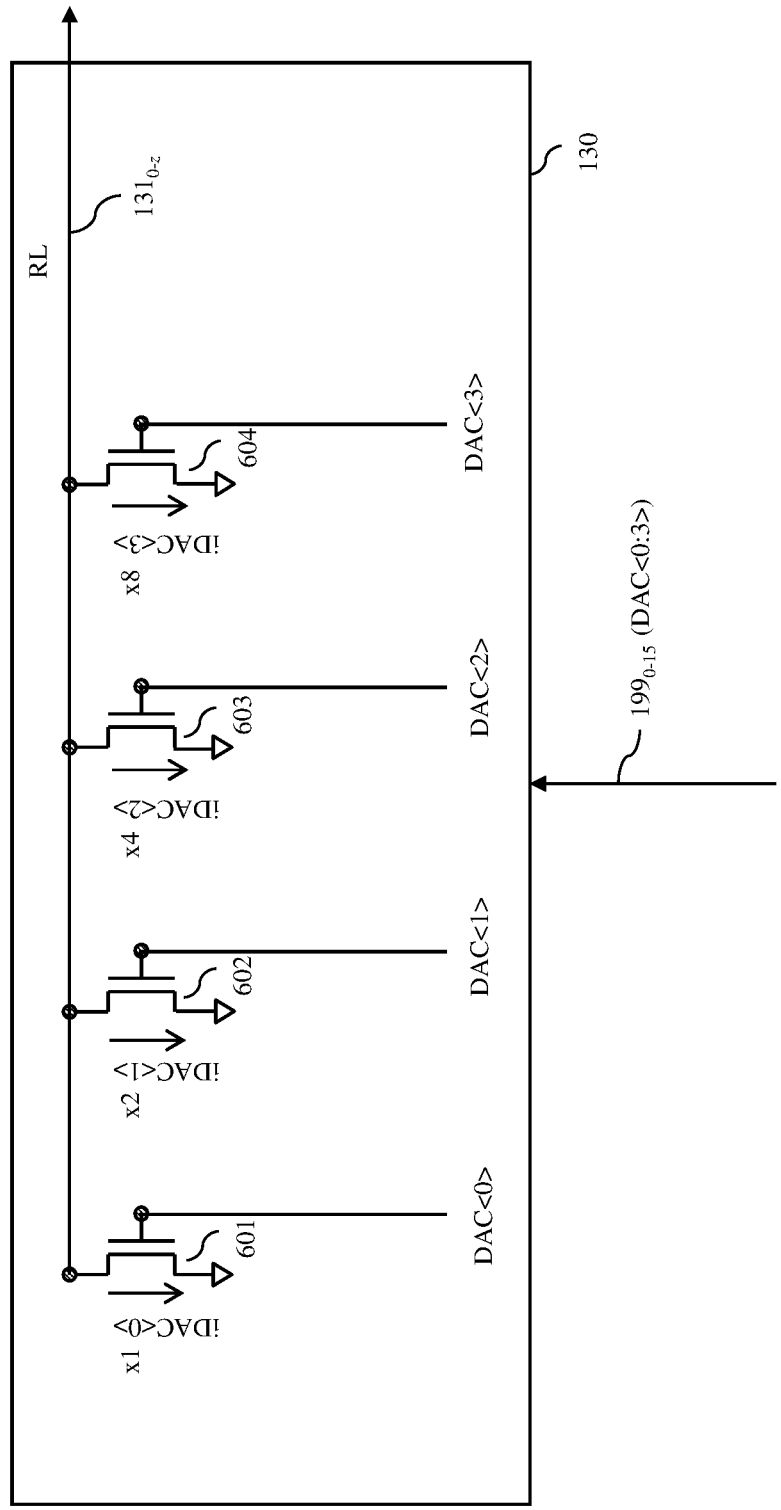
FIG. 6 is a circuit diagram illustrating an exemplary digital-to-analog converter that can be incorporated into the read circuit of the memory structure of FIG. 1.

The DAC 130 can be connected to a reference line (RL) and can be configured to generate a series of increasingly larger reference currents on the RL in response to a series of DAC codes 199$_{0-15}$ (DAC <0:3>) from the controller 190. FIG. 6 is a circuit diagram illustrating an exemplary DAC 130 that can be incorporated into the read circuit 193. The DAC 130 can include multiple n-type field effect transistors (NFETs) 601-604 connected in parallel to the RL. The NFETs 601-604 can be different sized NFETs for generating different sized currents on the RL when in an on state. For example, optionally, the NFET 602 can be twice as large as the NFET 601, the NFET 603 can be twice as large as the NFET 602 and the NFET 604 can be twice as large as the NFET 603. The DAC 130 can receive the series of different DAC codes 199$_{0-15}$ from the controller 190. The number of bits in each DAC code can be the same and can correspond to the number of NFETs in the DAC. Each bit position in the DAC codes can be associated with a corresponding one of the NFETs and can be applied to the gate of that NFET, thereby either turning on or off the NFET. Those skilled in the art will recognize that by turning on and/or off the NFETs in different combinations as dictated by different DAC codes, different reference currents can be generated on the RL. Thus, the series of DAC codes 199$_{0-15}$ provided to the DAC 130 by the controller 190 can be in a particular order to as to cause the DAC 130 to output a series of increasingly larger reference currents on the RL. Optionally, the DAC 130 can be configured so that the increases in the reference currents are in uniform increments.

For purposes of illustration, four NFETs 601-604 are shown in the DAC 130 of FIG. 6. Such a configuration would allow for the possibility of sixteen different DAC codes 199$_{0-15}$ for sixteen different combinations of on and/or off NFETs and thereby for the generation of sixteen different reference currents (Irefs) 131$_{0-15}$. It should, however, be understood that the DAC 130 could include some different number of NFETs to allow for some different number of combinations of on and/or off NFETs and thereby for the generation of some different number of reference currents (Irefs). Furthermore, some other DAC configuration could, alternatively, be employed.

The CSA 140 can have a data input node, which is connected by a data line (DL) to the column decoder 120 and thereby to a specific bitline 111. The CSA 140 can further have a reference input node, which is connected to the DAC 130 by a reference line (RL). The CSA 140 can further have an output node connected to both the first register 150 and the second register 160.

As mentioned above, whether the sensing process is Gm-based or G-based, each read operation of a selected memory cell 101 located at a specific column and specific row in the array 110 requires two discrete single-ended current sensing processes employing two different input voltages, respectively. Again, Gm-based sensing and G-based sensing differ only with respect to which input voltage is varied during the two discrete single-ended current sensing processes. For Gm-based sensing, the input voltage that is varied during the two discrete single-ended current sensing processes is the gate voltage. In this case, the drain voltage will be the same for both single-ended current sensing processes. For G-based sensing, the input voltage that is varied during the two discrete single-ended current sensing processes is the drain voltage. In this case, the gate voltage will be the same for both single-ended current sensing processes.

The CSA 140 can be configured so that, during the first single-ended current sensing process, a first output current (Io$_1$) 121 on the specific bitline 111 for the specific column (which is connected to the data input node by the column decoder 120 and DL) in response to the first input voltage is sensed at the data input node, so that the series of increasingly larger reference currents (Irefs) 131$_{0-x}$ generated by the DAC 130 on the RL are sensed at the reference input node, and so that a digital output signal 141 at the output node switches from a first voltage level (e.g., a low voltage level) to a second voltage level (e.g., a high voltage level) when one reference current of the series of increasingly larger reference currents (Irefs) 131$_{0-x}$ becomes greater than the first output current (Io$_1$) from the selected memory cell.

Similarly, the CSA 140 can be configured so that, during the second single-ended current sensing process, a second output current (Io$_2$) 121 on the specific bitline 111 (again which is connected to the data input node by the column decoder 120 and DL) in response to the second input voltage is sensed at the data input node, so that the series of increasingly larger reference currents (Irefs) 131$_{0-x}$ generated by the DAC 130 on the RL are sensed at the reference input node, and so that a digital output signal 141 at the output node switches from a first voltage level (e.g., a low voltage level) to a second voltage level (e.g., a high voltage level) when one reference current of the series of increasingly larger reference currents 131$_{0-x}$ becomes greater than the second output current (Io$_2$) from the selected memory cell.

In these single-ended current sensing processes, the particular reference current that first triggers switching of the digital output signal 141 from the first voltage level to the second voltage level will be within one DAC increment of the output current. Thus, the particular reference current is known to be approximately equal to the actual output current (i.e., $Io_1$ in the first single-ended current sensing process or 102 in the second single-ended current sensing process and the particular DAC code (e.g., one of DAC codes $199_{0-15}$) that was used to generate the particular reference current can be captured by the appropriate register. That is, for the first single-ended current sensing process, a first DAC code ($DAC_{11}$) corresponding to and, more particularly, approximating $Io_1$ can be captured and stored in the first register 150 associated with the first input voltage (e.g., $Vg_1$ for Gm-based sensing or $Vd_1$ for G-based sensing) when the digital output signal 141 from the CSA 140 switches from the first voltage level to the second voltage level (i.e., from low to high). For the second single-ended current sensing process, a second DAC code ($DAC_{12}$) corresponding to and, more particularly, approximating 102 can be captured and stored in the second register 160 associated with the second input voltage (e.g., $Vg_2$ for Gm-based sensing or $Vd_2$ for G-based sensing) when the digital output signal 141 from the CSA 140 switches from the first voltage level to the second voltage level (i.e., from low to high).

Figure 7:
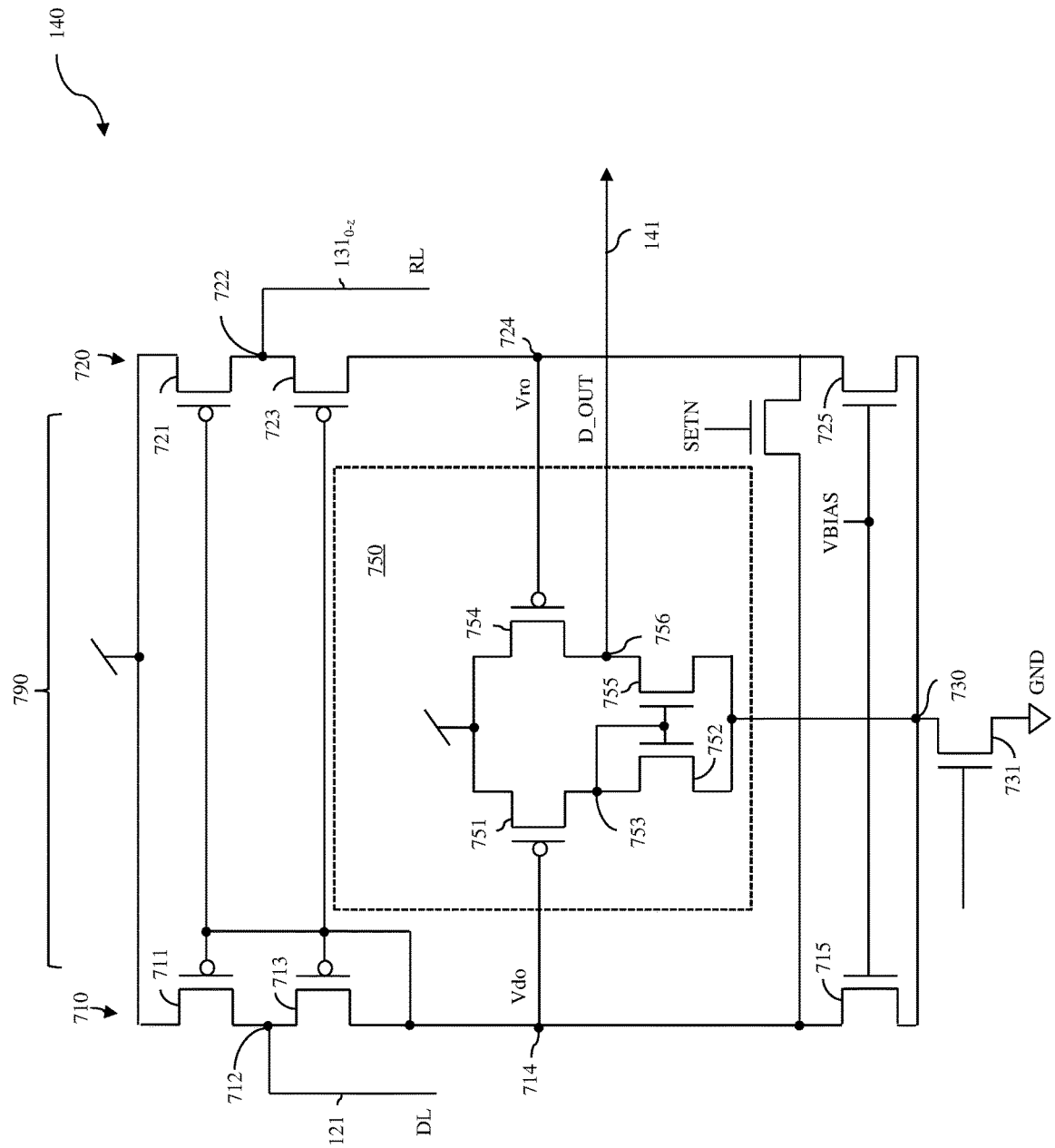
FIG. 7 is a circuit diagram illustrating an exemplary current sense amplifier that can be incorporated into the read circuit of the memory structure of FIG. 1.

FIG. 7 is a circuit diagram illustrating an exemplary CSA 140 that can be incorporated into the read circuit 193 and can function, as described above. Specifically, this CSA 140 can include a current mirror circuit 790 coupled to a voltage comparator 750.

The current mirror 790 can include a data section 710 and a reference section 720. The data section 710 can include, for example, two first P-type field effect transistors (PFETs) 711, 713 and a first N-type field effect transistor (NFET) 715 electrically connected in series between a positive supply voltage rail and a pull-down node 730. The data section 710 can further include the data input node 712 at the junction between the two first PFETs 711, 713. As discussed above, the data input node 712 can be connected to the data line (DL) and thereby connected, via the column decoder 120, to a specific bitline 111 for a specific column containing a selected memory cell. The data section 710 can further include a data voltage node 714 at the junction between the first PFET 713 and the first NFET 715. The reference section 720 can include two second PFETs 721, 723 and a second NFET 725 electrically connected in series between the supply voltage and the same pull-down node 730. The reference section 720 can further include the reference input node 722 at the junction between the two second PFETs 721, 723. As discussed above, the reference input node 722 can be electrically connected the reference line (RL) and thereby to the DAC 130. The reference section 720 can further include a reference voltage node 724 at the junction between the second PFET 723 and the second NFET 725. Additionally, the pull-down node 730 can be electrically connected to ground through a footer device 731 (e.g., an additional NFET). The gate of the footer device 731 can be controlled by a read control signal. The gates of the first NFET 715 and the second NFET 725 can be controlled by a bias voltage signal (VBIAS). Finally, the gates of the first PFETs 711, 713 within that data section 710 and the gates of the second PFETs 721, 723 within the reference section 720 can be connected to the data voltage node 714.

During the first single-ended current sensing process using the first input voltage (e.g., $Vg_1$ for Gm-based sensing or $Vd_1$ for G-based sensing), the read control signal and voltage bias signals can go high so that the footer device 731 and the first and second NFETs 715 and 725 are turned on.

As a result, the first output current ($Io_1$) 121 is sensed at the data input node 712, resulting in a first data output voltage ($Vdo_1$) on the data voltage node 714. Those skilled in the art will recognize that Vdo will be relatively high when Io is relatively low and vice versa. Furthermore, in the case of a Vt-programmable FET, Io will be relatively low when the Vt is high (e.g., when the Vt-programmable FET is considered to be programmed and, thereby storing data with a first logic value and, particularly, a logic value of "1"), whereas Io will be relatively high when the Vt is low (e.g., when the Vt-programmable FET is considered to be unprogrammed and, thereby storing data with a second logic value and, particularly, a logic value of "0"). Concurrently, the series of increasingly larger reference currents $131_{0-z}$ from the DAC 130 are sensed at the reference input node 722, resulting in a series of decreasingly smaller reference output voltages ($Vro_{0-15}$) on the reference voltage node 724. The voltage comparator 750 can be coupled to both the data voltage node 714 and the reference voltage node 724 and can output a digital output signal 141 (D_OUT) indicative of the voltage differential on these two nodes 714 and 724. Specifically, the voltage comparator 750 can include a PFET 751 and an NFET 752 connected in series between a positive supply voltage rail and the pull-down node 730 and an additional PFET 754 and an additional NFET 755 also connected in series between the positive supply voltage rail and the pull-down node 730. The gate of the PFET 751 can be connected to the data voltage node 714 and the gate of the PFET 754 can be connected to the reference voltage node 724. An intermediate voltage node 753 at the junction between the PFET 751 and the NFET 752 can be connected to the gates of the NFET 752 and the additional NFET 755. The digital output signal (D_OUT) 141 can be output from a digital output node 756 at the junction between the PFET 754 and the NFET 755. When a reference output voltage (Vro) at the reference voltage node 724 is higher than the first data output voltage ($Vdo_1$) at the data voltage node 714, the digital output signal 141 from the CSA 140 to the first and second registers 150 and 160 will be at a low voltage level (i.e., a logic value of "0"). Specifically, the PFET 751 will turn on first, pulling up the voltage level on the intermediate voltage node 753 and causing the NFET 755 to pull-down the voltage level on the digital output node 756. However, when a reference output voltage (Vro) at the reference voltage node 724 drops below the first data output voltage ($Vdo_1$) at the data voltage node 714, then the digital output signal 141 from the CSA 140 to the first and second registers 150 and 160 will switch to the high voltage level (i.e., to a logic value of "1"). That is, the PFET 754 will turn on first, pulling up the voltage level on the digital output node 756. Switching of the digital output signal 141 from the CSA 140 to the high voltage level is an indication that the particular reference current currently on RL is just greater than $Io_1$ at the data input node 712. For this first single-ended current sensing process, the first DAC code ($DAC_{11}$) corresponding to and, more particularly, approximating $Io_1$ at the data input node 712 can be captured and stored in the first register 150 (which is associated with the first input voltage) when the digital output signal 141 from CSA 140 switches from the first voltage level to the second voltage level (e.g., from low to high).

The above-described processes can be repeated for the second single-ended current sensing process directed to the same selected memory cell but using a different input voltage. Specifically, during the second single-ended current sensing process associated with the second input voltage (e.g., $Vg_2$ for Gm-based sensing or $Vd_2$ for G-based sensing), the read control signal and voltage bias signals are switched to high voltage levels so as to turn on the footer device 731 as well as the first and second NFETs 715 and 725. As a result, a second output current ($Io_2$) 121 is sensed at the data input node 712, resulting in a second data output voltage ($Vdo_2$) on the data voltage node 714. Concurrently, the same series of increasingly larger reference currents 131$_{0-z}$ are sensed at the reference input node 722, resulting in the same series of decreasingly smaller reference output voltages ($Vro_{0-15}$) on the reference voltage node 724. When a reference output voltage (Vro) at the reference voltage node 724 is higher the second data output voltage ($Vdo_2$) at the data voltage node 714, the digital output signal 141 from the CSA 140 to the first and second registers 150 and 160 will be at a low voltage level (i.e., a logic value of "0"). However, when a reference output voltage (Vro) at the reference voltage node 724 drops below the second data output voltage ($Vdo_2$) at the data voltage node 714, then the digital output signal 141 from the CSA 140 to the first and second registers 150 and 160 will again switch to the high voltage level (i.e., to a logic value of "1"). Switching of the digital output signal 141 from the CSA 140 to the high voltage level is an indication that the particular reference current currently on RL is just greater than $Io_2$ at the data input node 712. For this second single-ended current sensing process, the second DAC code ($DAC_{12}$) corresponding to and, more particularly, approximating 102 at the data input node 712 can be captured and stored in the second register 160 (which is associated with the second input voltage) when the digital output signal 141 from the CSA 140 switches from the first voltage level to the second voltage level (e.g., from low to high).

Figure 8:
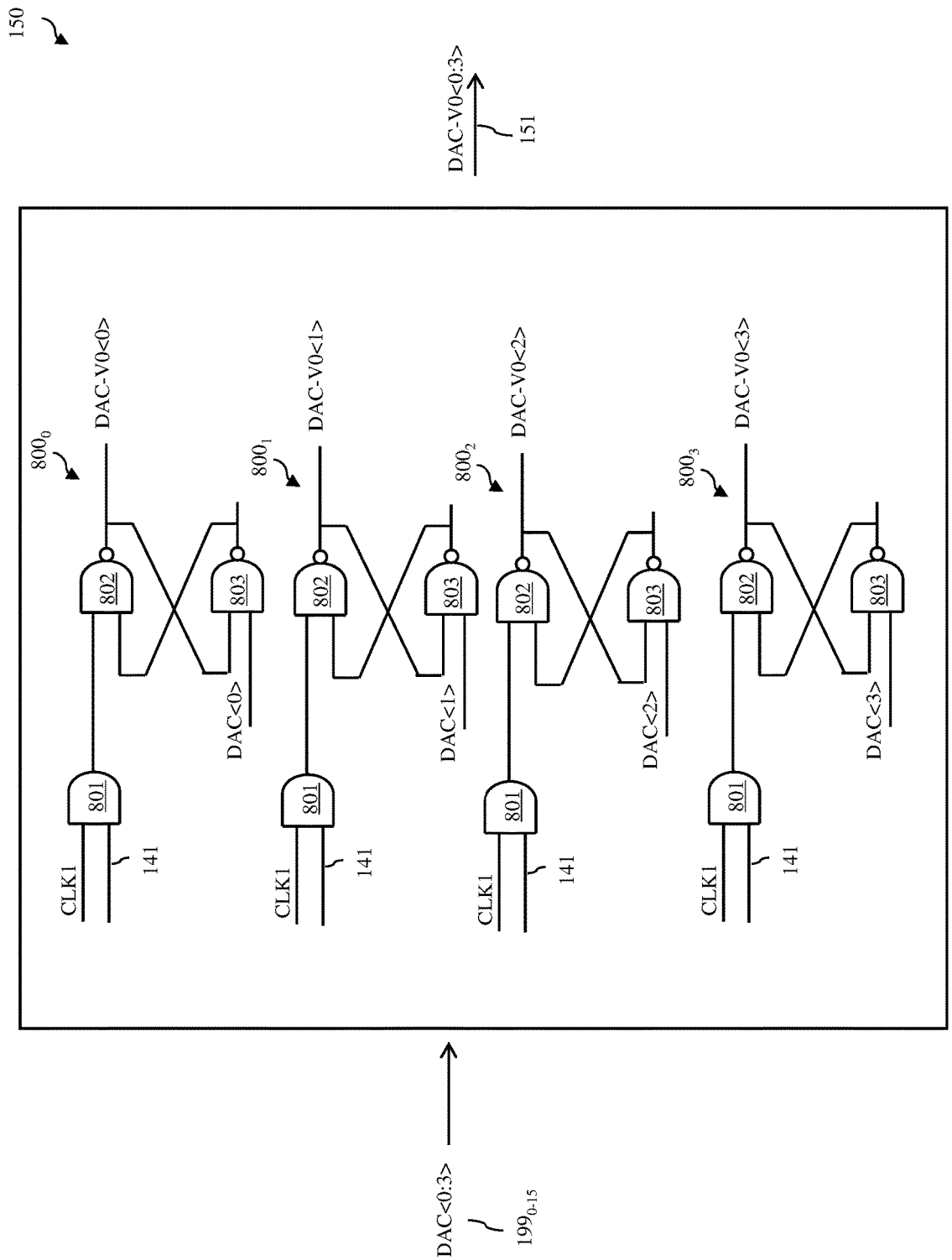
FIGS. 8 and 9 are circuit diagrams of exemplary registers that can be incorporated into the read circuit of the memory structure of FIG. 1.
Figure 9:
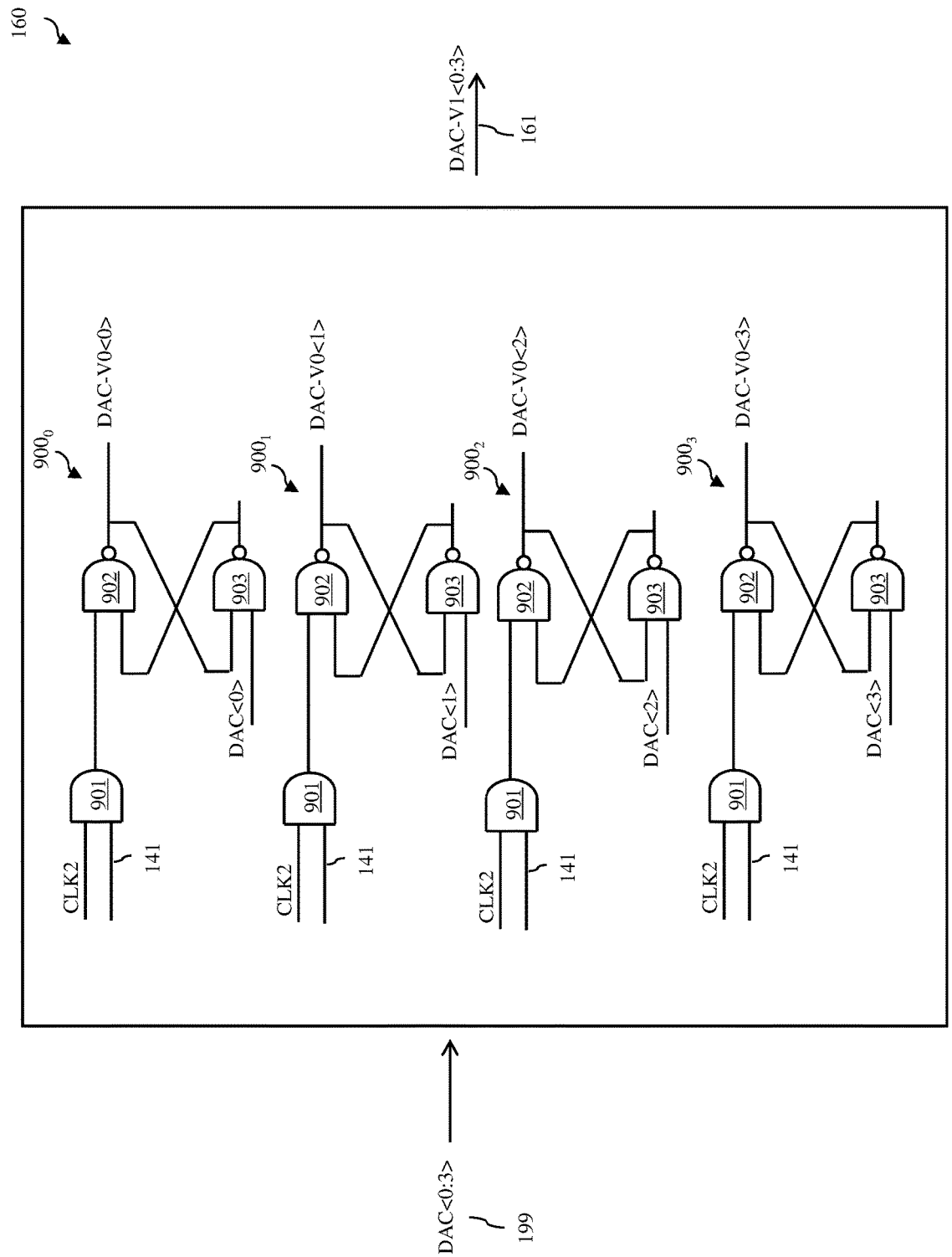

FIGS. 8 and 9 are circuit diagrams illustrating exemplary first and second registers 150 and 160, respectively, that can be incorporated into the read circuit 193 and associated with the first and second input voltages, respectively. The first and second registers 150 and 160 can be essentially identical but controlled by different clock signals (CLK1 and CLK2) so that the first register 150 captures the first DAC code ($DAC_{11}$) from the first single-ended current sensing process associated with the first input voltage and so that the second register 160 captures the second DAC code ($DAC_{12}$) from the second single-ended current sensing process associated with the second input voltage. It should be noted that the clocks signals (CLK1 and CLK2) can be generated (e.g., by a clock signal generator) such that CLK1 is only high during the first single-ended current sensing process, so that CLK2 is only high during the second single-ended current sensing process, and so that CLK1 and CLK2 are never high at the same time.

Specifically, the first register 150 and the second register 160 can each receive the digital output signal 141 from the CSA 140 and the same series of DAC codes 199$_{0-15}$. The first register 150 and the second register 160 can each include multiple sections 800$_{0-3}$, 900$_{0-3}$ with each one of the sections being essentially identical. Each section 800$_{0-3}$, 900$_{0-3}$ can be configured to process one bit position of DAC code subject to capture. Specifically, each section 800$_{0-3}$, 900$_{0-3}$ can include an AND gate 801, 901. The inputs to the AND gate 801, 901 can be a clock signal (i.e., CLK1 in the case of the AND gates 801 of each section 800$_{0-3}$ in the first register 150 and CLK2 in the case of the AND gates 901 in of each section 900$_{0-3}$ in the second register 160) and the digital output signal 141 from the CSA 140. Each AND gate 801, 901 can be configured to behave according to a conventional AND gate truth table. That is, the output of each AND gate will be low until such time as both the received clock signal (i.e., CLK1 for AND gates 801 or CLK2 for AND gates 901) is high and the digital output signal 141 from the CSA 140 is also high. Each section 800$_{0-3}$, 900$_{0-3}$ of each register can further include a pair of cross-coupled NAND gates 802-803, 902-903. The inputs of the first NAND gate 802, 902 can be the outputs of the AND gate 801, 901 and the second NAND gate 803, 903. The inputs of the second NAND gate 803, 903 can be a corresponding bit from next DAC code (e.g., DAC<0>, DAC<1>, etc.) to be stored and the output of the first NAND gate 802, 902. Each NAND gate can be configured to behave according to a conventional NAND gate truth table. That is, the output of each NAND gate will be high until such time as both inputs are high and then it will switch to low.

Thus, within the first register 150, the first DAC code ($DAC_{11}$) corresponding to and, more particularly, approximating $Io_1$ can only be captured and stored in the first register 150 when CLK1 (which is associated with the first single-ended sensing process that employs the first input voltage) switches from low to high and when the digital output signal 141 from the CSA 140 also switches from the first voltage level to the second voltage level (e.g., from a low voltage level to a high voltage level). Similarly, within the second register 160, the second DAC code ($DAC_{12}$) corresponding to and, more particularly, approximating 102 can only be captured and stored in the second register 160 when CLK2 (which is associated with the second single-ended sensing process that employs the second input voltage) switches from low to high and when the digital output signal 141 from the CSA 140 also switches from the first voltage level to the second voltage level (e.g., from the low voltage level to the high voltage level).

As mentioned above, following completion of the two single-ended current sensing processes directed to the same selected memory cell but using different input voltages, processing elements 195 (e.g., an I-V slope calculator 170 and a bit generator 180) that are within the read circuit 193, as illustrated, or, alternatively, outside the read circuit 193 (e.g., in the controller 190) or even outside the memory structure 100 can then calculate a current-voltage (I-V) slope characteristic for the selected memory cell (e.g., mutual conductance (Gm) or conductance (G) of the selected memory cell depending upon the type of input voltage used) using the results stored in the registers, can perform a comparison of the I-V slope characteristic to a reference I-V slope characteristic, and can generate and output a bit indicative of the data storage state of the selected memory cell based on the comparison.

For example, referring again to FIG. 1, the I-V slope calculator 170 can be connected to both the first register 150 and the second register 160. The I-V slope calculator 170 can be configured to receive the first DAC code 151 ($DAC_{11}$) from the first register 150 and the second DAC code 161 ($DAC_{12}$) from the second register 160 and to calculate and output a I-V slope value 171 for the selected memory cell based on $DAC_{11}$ and $DAC_{12}$ and further based on previously stored digital values corresponding to the first input voltage and the second input voltage (e.g., $DAC_{V1}$ and $DAC_{V2}$). Specifically, the I-V slope calculator 170 can be configured calculate a digital I-V slope value for the selected memory cell using the following equation:

$$\text{Digital I-V slope} = (DAC_{12} - DAC_{11})/(DAC_{V2} - DAC_{V1}) \tag{6}$$

That is, the digital I-V slope value 171 can be calculated as the ratio of the difference between $DAC_{12}$ (which approximates the second output current ($Io_2$) that results from the second single-ended current sensing process performed using the second input voltage) and $DAC_{I1}$ (which approximates the first output current ($Io_1$) that results from the first single-ended current sensing process performed using the first input voltage) to the difference between the two input voltages in digital format. For Gm-based sensing, $DAC_{V1}$ and $DAC_{V2}$ correspond to the two different gate voltages used during the two discrete single-ended current sensing processes where the drain voltage is the same. For G-based sensing, $DAC_{V1}$ and $DAC_{V2}$ correspond to the two different drain voltages used during the two discrete single-ended current sensing processes where the gate voltage is the same.

The bit generator 180 can be connected to the I-V slope calculator 170. The bit generator 180 can be configured to receive the digital I-V value 171 for the selected memory cell from the I-V slope calculator 170 (e.g., either a digital Gm value in the case of Gm-based sensing or a digital G value in the case of G-based sensing) and to perform a comparison of the digital I-V slope value 171 and a reference I-V slope value 172 also in digital format (e.g., either a reference Gm value or a reference G value, as applicable). The bit generator 180 can further be configured to output a bit 181 with a logic value dependent upon the results of the comparison. For example, the bit generator 180 can be configured to output a bit 181 with a first logic value (e.g., a logic value of "1") indicating that the selected memory cell is programmed (e.g., has a high Vt in the case of a Vt-programmable FET and thereby stores a data value of "1") when the I-V slope value 171 is less than or equal to the reference I-V slope value 172 and a second logic value (e.g., a logic value of "0") indicating that the selected memory cell is not programmed (e.g., has a low Vt in the case of a Vt-programmable FET and thereby stores a data value of "0") when the I-V slope value 171 is greater than the reference I-V slope value 172.

It should be noted that the reference I-V slope value 172 can be set approximately midway within the I-V slope programming window (PW) (i.e., between the expected I-V slope value for a programmed memory cell and the expected I-V slope value for an unprogrammed memory cell). For example, for Gm-based sensing, the reference I-V slope value 172 can be a reference Gm value set approximately midway within the Gm programming window (PW) (i.e., between the expected Gm value for a programmed memory cell and the expected Gm value for an unprogrammed memory cell). Similarly, for G-based sensing, the reference I-V slope value 172 can be a reference G value set approximately midway within the G programming window (PW) (i.e., between the expected G value for a programmed memory cell and the expected G value for an unprogrammed memory cell).

Figure 10:
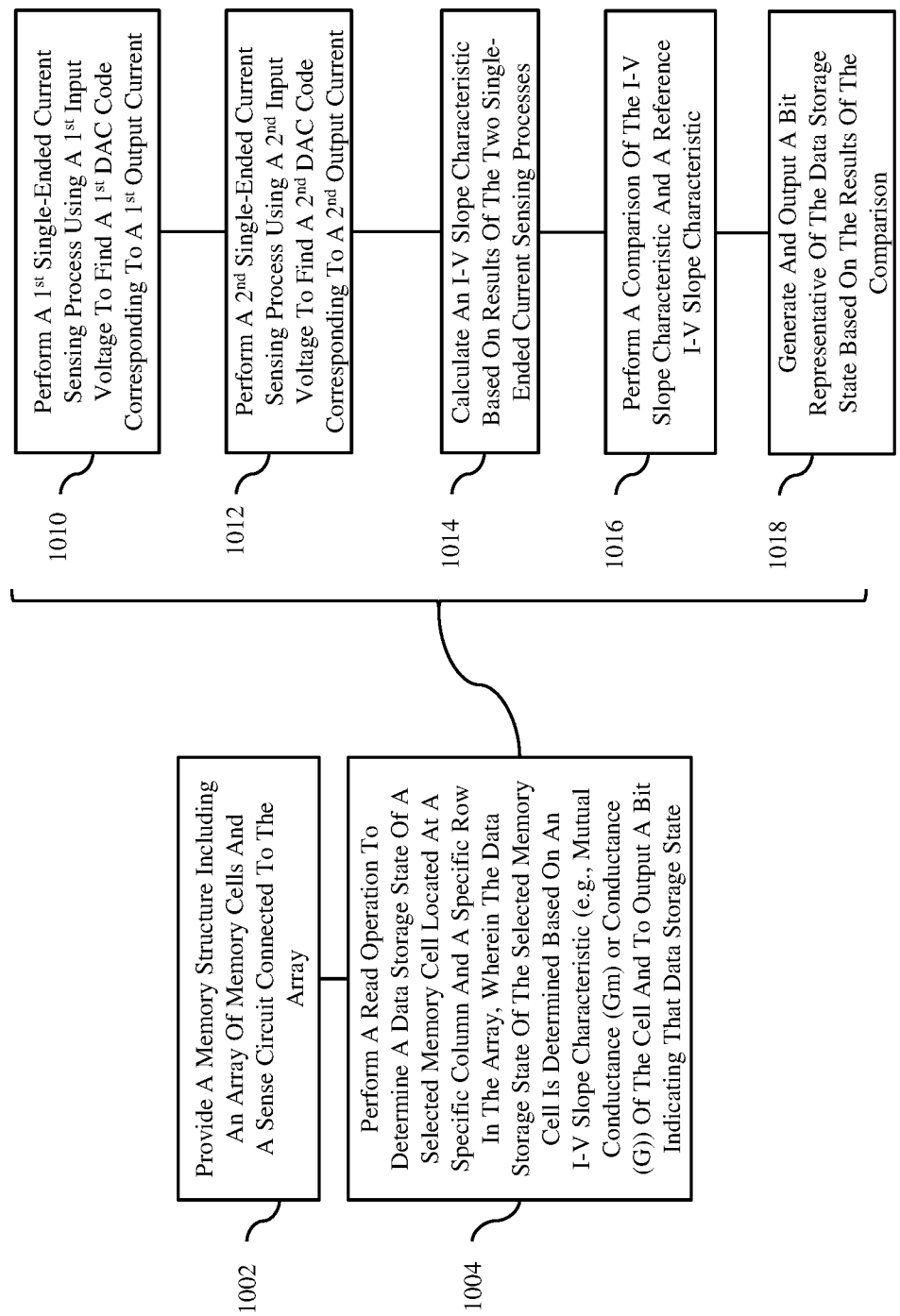
FIG. 10 is a flow diagram illustrating disclosed method embodiments.

Referring to the flow diagram of FIG. 10, also disclosed herein are method embodiments associated with the above-described memory structures.

The method can include providing a memory structure, such as the memory structure 100 shown in FIG. 1 (see process step 1002). As described in greater detail above and illustrated in the drawings, the memory structure 100 can include an array 110 of memory cells 101. The memory cells 101 can be, for example, Vt-programmable FET-type memory cells, as shown in FIG. 2A. The Vt-programable FET-type memory cells could be charge-trap FET-type memory cells (see FIGS. 3A-3B), ferroelectric FET-type memory cells (see FIGS. 4A-4B), floating gate-type memory cells (see FIGS. 4A-4B) or any other suitable Vt-programmable FET-type memory cells. Alternatively, the memory cells 101 could be DRAM-type memory cells, as shown in FIG. 2B, or any other suitable type of memory cell typically subjected to single-ended sensing. In any case, the memory cells 101 can be arranged in columns and rows. The memory structure 100 can further include bitlines 111 for the columns with all memory cells 101 in a column connected to a bitline for the column and wordlines 112 for the rows with all memory cells in a row connected to a wordline for the row. The memory structure 100 can further include a read circuit 193 connected to the array 110 and, particularly, to the bitlines 111.

Generally, the method can further include performing a read operation to detect a data storage state of a selected memory cell 101 at a specific column and specific row within the array 110 and to output a bit 181 indicating that data storage state (see process step 1004). At process step 1004, data storage state detection is specifically based on a current (I)-voltage (V) slope characteristic. For example, the method can include: performing two discrete single-ended current sensing processes at two different input voltages, respectively and determining, by the read circuit 193, an I-V slope characteristic of the selected memory cell 101 based two different output currents sensed during the two discrete single-ended current sensing processes. In some embodiments, the I-V slope characteristic can be mutual conductance (Gm) and the different input voltages used during the discrete single-ended current sensing processes can be different gate voltages. In other embodiments, the I-V slope characteristic can be conductance (G) and the different input voltages used during the discrete single-ended current sensing processes can be different drain voltages. The method can further include performing, by the read circuit 193, a comparison of the I-V slope characteristic 171 and a reference I-V slope characteristic 172 (e.g., a comparison of the Gm value to a reference Gm value in the case of Gm-based sensing or a comparison of the G value to a reference G value in the case of G-based sensing) in order to detect the data storage state of the selected memory cell; and outputting, by the read circuit 193, a bit 181 representative of the data storage state of the selected memory cell 101 based on the results of the comparison.

More specifically, referring to FIGS. 1 and 6-9, to detect the data storage state of a selected memory cell 101 in a specific column and a specific row of the array 110 at process step 1004, the method can include selectively connecting (e.g., by the column decoder 120 of the read circuit 193 in response to a column address from the controller 190), a specific bitline 111 for the specific column to the DL and, thereby to the data input node 712 of the current sense amplifier 140.

The method can further include performing two discrete single-ended current sensing processes directed to the same selected memory cell (see the first single-ended current sensing process at process step 1010 and the second single-ended current sensing process at process step 1012). During these two discrete single-ended current sensing processes, an input voltage is varied. That is, a first input voltage ($Vi_1$) is used for the first single-ended current sensing processes and a second input voltage ($Vi_2$) that is different from the first input voltage is used for the second single-ended current sensing process. The specific input voltage that is varied during the single-ended current sensing processes depends upon the type of sensing being performed.

For example, for Gm-based sensing, the first single-ended current sensing process can include applying a first gate voltage ($Vg_1$) to the specific wordline 112 for the specific row containing the selected memory cell 101 (and thereby to the gate of the FET of the selected memory cell and maintaining the drain voltage of the FET of the selected memory cell at some Vd (e.g., via the specific bitline for the specific column containing the selected memory cell). The second single-ended current sensing process can include applying a second gate voltage ($Vg_2$) to the specific wordline 112 for the specific row containing the selected memory cell 101 (and thereby to the gate of the FET of the selected memory cell) and again maintaining the drain voltage of the FET of the selected memory cell at some Vd.

For G-based sensing, process step 1010 can include applying a gate voltage (Vg) to the specific wordline 112 for the specific row containing the selected memory cell 101 (and thereby to the gate of the cell FET) and maintaining a first drain voltage ($Vd_1$) on the drain of the cell FET (via the specific bitline 111 for the specific column containing the selected memory cell 101). Process step 1012 can include applying the same gate voltage (Vg) to the specific wordline 112 for the specific row containing the selected memory cell 101 (and thereby to the gate of the cell FET) and maintaining a second drain voltage ($Vd_2$) on the drain of the cell FET (via the specific bitline 111).

In any case, the first single-ended current sensing process) can further include causing the read control signal and voltage bias signals to go high so to turn on the footer device 731 and the first and second NFETs 715 and 725. The first single-ended current sensing process can further include sensing, by the current sense amplifier 140, of a first output current ($Io_1$) 121 at the data input node 712 and resulting in a first data output voltage ($Vdo_1$) on the data voltage node 714. As mentioned above, Vdo will be relatively high when Io is relatively low and vice versa. Furthermore, in the case of a Vt-programmable FET, Io will be relatively low when the Vt is high (e.g., when the Vt-programmable FET is considered to be programmed and, thereby storing data with a first logic value and, particularly, a logic value of "1"), whereas Io will be relatively high when the Vt is low (e.g., when the Vt-programmable FET is considered to be unprogrammed and, thereby storing data with a second logic value and, particularly, a logic value of "0"). The first single-ended current sensing process can further include concurrent sensing, by the current sense amplifier 140, of a series of increasingly larger reference currents $131_{0-z}$ from the DAC 130 at the reference input node 722 and resulting in a series of decreasingly smaller reference output voltages ($Vro_{0-15}$) on the reference voltage node 724. The first single-ended current sensing process can further include comparing, by the current sense amplifier (CSA) 140 and, particularly, by a voltage comparator 750 therein, of the first data output voltage ($Vdo_1$) on the data voltage node 714 to the reference output voltages ($Vro_{0-15}$) on the reference voltage node 724 and outputting, by the voltage comparator 750, of a digital output signal 141 (D_OUT) indicative of the voltage differential on these two nodes 714 and 724. Specifically, when a reference output voltage (Vro) at the reference voltage node 724 is higher than the first data output voltage ($Vdo_1$) at the data voltage node 714, the digital output signal 141 will be at a low voltage level (i.e., to a logic value of "0"). However, when a reference output voltage (Vro) at the reference voltage node 724 drops below the first data output voltage ($Vdo_1$) at the data voltage node 714, then the digital output signal 141 will switch to the high voltage level (i.e., to a logic value of "1"). Switching of the digital output signal 141 to the high voltage level is an indication that the particular reference current currently on RL is just greater than $Io_1$ at the data input node 712. For this first single-ended current sensing process, a first DAC code ($DAC_{11}$) corresponding to and, more particularly, approximating $Io_1$ at the data input node 712 can be captured and stored in the first register 150 associated with the first input voltage ($Vi_1$) (e.g., with the $Vg_1$ for Gm-based sensing or with $Vd_1$ for G-based sensing) when the digital output signal 141 from CSA 140 switches from the first voltage level to the second voltage level (e.g., from a low voltage level to a high voltage level).

Similarly, the second single-ended current sensing process can further include causing the read control signal and voltage bias signals to go high so to turn on the footer device 731 and the first and second NFETs 715 and 725. The second single-ended current sensing process can further include sensing, by the current sense amplifier 140, of a second output current ($Io_2$) 121 at the data input node 712, resulting in a second data output voltage ($Vdo_2$) on the data voltage node 714. The second single-ended current sensing process can further include concurrent sensing, by the current sense amplifier 140, of the same series of increasingly larger reference currents $131_{0-z}$ from the DAC 130 at the reference input node 722, resulting in a series of decreasingly smaller reference output voltages ($Vro_{0-15}$) on the reference voltage node 724. The second single-ended current sensing process can further include comparing, by the current sense amplifier (CSA) 140 and, particularly, by the voltage comparator 750 therein, of the second data output voltage ($Vdo_2$) on the data voltage node 714 to the reference output voltages ($Vro_{0-15}$) on the reference voltage node 724 and outputting, by the voltage comparator 750, a digital output signal 141 (D_OUT) indicative of the voltage differential on these two nodes 714 and 724. Specifically, when a reference output voltage (Vro) at the reference voltage node 724 is higher than the second data output voltage ($Vdo_2$) at the data voltage node 714, the digital output signal 141 will be at a low voltage level (i.e., to a logic value of "0"). However, when a reference output voltage (Vro) at the reference voltage node 724 drops below the second data output voltage ($Vdo_2$) at the data voltage node 714, then the digital output signal 141 will switch to the high voltage level (i.e., to a logic value of "1"). Switching of the digital output signal 141 to the high voltage level is an indication that the particular reference current currently on RL is just greater than $Io_2$ at the data input node 712. For this second single-ended current sensing process, a second DAC code ($DAC_{12}$) corresponding to and, more particularly, approximating 102 at the data input node 712 can be captured and stored in the second register 150 associated with the second input voltage ($Vi_2$) when the digital output signal 141 from CSA 140 switches from the first voltage level to the second voltage level (e.g., from a low voltage level with a logic value of "0" to a high voltage level with a logic value of "1").

The method can further include receiving, by the I-V slope calculator 170, the first DAC code 151 ($DAC_{11}$) from the first register 150 and the second DAC code 161 ($DAC_{12}$) from the second register 160. The method can further include calculating, by the I-V slope calculator 170, a digital I-V slope value 171 for the selected memory cell based on the first DAC code 151 ($DAC_{11}$) and the second DAC code 161 ($DAC_{12}$) and further based on digital values associated with the first input voltage ($DAC_{V1}$) and the second input voltage ($DAC_{V2}$) (see process step 1014 and equation (6) above). It should be understood that, for Gm-based sensing, $DAC_{V1}$ and $DAC_{V2}$ correspond to the two different gate voltages ($Vg_1$ and $Vg_2$) used at process steps 1010 and 1012 and the digital I-V slope value 171 calculated at process step 1014 will be a digital mutual conductance (Gm) value; whereas, for G-based sensing, $DAC_{V1}$ and $DAC_{V2}$ correspond to the two different drain voltages ($Vd_1$ and $Vd_2$) used at process steps 1010 and 1012 and the digital I-V slope value 171 calculated at process step 1014 will be a digital conductance (G) value.

The method can further include receiving, by the bit generator 180 from the I-V slope calculator 170, the digital I-V slope value 171 for the selected memory cell and performing, by the bit generator 180, a comparison of the digital I-V slope value 171 and a reference I-V slope value 172 (see process step 1016). It should be understood that, for Gm-based sensing, the comparison performed at process step 1016 is a comparison of a digital Gm value to a digital reference Gm value; whereas, for G-based sensing, the comparison performed at process step 1016 is a comparison of a digital G value to a digital reference G value.

The method can further include generating and outputting, by the bit generator 180, a bit 181 with a logic value that is dependent upon the results of the comparison (see process step 1018). For example, the bit 181 can have a first logic value (e.g., a logic value of "1") indicating that the selected memory cell is programmed (e.g., has a high Vt in the case of a Vt-programmable FET and thereby stores a data value of "1") when the digital I-V slope value 171 is less than or equal to the reference I-V slope value 172 and a second logic value (e.g., a logic value of "0") indicating that the selected memory cell is not programmed (e.g., has a low Vt in the case of a Vt-programmable FET and thereby stores a data value of "0") when the digital I-V slope value 171 is greater than the reference I-V slope value 172. It should be noted that the reference I-V slope value 172 can be set approximately midway within the programming window (PW) (i.e., between the expected I-V slope value for a programmed memory cell and the expected I-V slope value for an unprogrammed memory cell).

In any case, by comparing an I-V slope characteristic for a memory cell (which is acquired through two consecutive single-ended current sensing processes using two different input voltages, respectively) to a reference I-V slope characteristic to detect the data storage state of the memory cell as opposed to comparing a single output current characteristic (which is acquired through a single single-ended current sensing process) to a reference output current characteristic, the above-described memory structure 100 and method embodiments can significantly reduce retention loss of the memory cell programming window (PW) over time and with increased operating temperatures.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
    an array of memory cells; and
    a read circuit comprising:
        a current sense amplifier comprising: a data input node;
            a reference input node;
        and an output node;
        a column decoder connected between the array and the data input node;
        a digital-to-analog converter connected to the reference input node; and
        multiple registers connected to the output node, wherein the registers are controlled by different clock signals.

2. The memory structure of claim 1, further comprising bitlines for the columns, wherein each bitline is connected to all the memory cells in a corresponding column,
    wherein the column decoder is configured to connect a bitline of the bitlines to a data line connected to the data input node for single-ended current sensing of a memory cell connected to the bitline,
    wherein the multiple registers comprise a first register controlled by a first clock signal and a second register controlled by a second clock signal that is different from the first clock signal, and
    wherein the digital-to-analog converter, the first register and the second register receive a series of digital-to-analog converter codes during a first single-ended current sensing process directed to the memory cell using a first input voltage and further during a second single-ended current sensing process directed to the memory cell using a second input voltage that is different from the first input voltage.

3. The memory structure of claim 2,
    wherein, during the first single-ended current sensing process, the second clock signal is maintained at a first voltage level, the first clock signal switches from the first voltage level to a second voltage level, the digital-to-analog converter outputs a series of increasingly larger reference currents in response to the series of digital-to-analog converter codes to a reference line connected to the reference input node, the current sense amplifier compares the series of increasingly larger reference currents to a first output current on the bitline and switches the output signal at the output node from the first voltage level to the second voltage level in response to a first reference current of the series being higher than the first output current, and the first register captures and stores a first digital-to-analog converter code corresponding to the first reference current when the first clock signal and the output signal are both at the second voltage level, and wherein, during the second single-ended current sensing process, the memory cell receives a second input voltage, the first clock signal is maintained at the first voltage level, the second clock signal switches from the first voltage level to the second voltage level, the digital-to-analog converter outputs the series of increasingly larger reference currents in response to the series of digital-to-analog converter codes to the reference line, the current sense amplifier compares the series of increasingly larger reference currents to a second output current on the bitline and switches the output signal at the output node from the first voltage level to the second voltage level in response to a second reference current of the series being higher than the second output current, and the second register captures and stores a second digital-to-analog converter code corresponding to the second reference current when the second clock signal and the output signal are both at the second voltage level.

4. The memory structure of claim 3, wherein the read circuit further comprises:
a current-voltage slope calculator connected to the first register and to the second register, wherein the current-voltage slope calculator receives the first digital-to-analog converter code from the first register, receives the second digital-to-analog converter code from the second register and calculates a current-voltage slope value as a ratio of a difference between the second digital-to-analog converter code and the first digital-to-analog converter code to a difference between a second digital value corresponding to the second input voltage and a first digital value corresponding to the first input voltage; and
a bit generator connected to the current-voltage slope calculator, wherein the bit generator receives the current-voltage slope value, performs a comparison of the current-voltage slope value to a reference current-voltage slope value, and outputs a bit based on results of the comparison, wherein the bit has a first logic value when the current-voltage slope value is less than or equal to the reference current-voltage slope value and has a second logic value when the current-voltage slope value is greater than the reference current-voltage slope value.

5. The memory structure of claim 4, wherein the first input voltage and the second input voltage are different gate voltages, wherein the current-voltage slope value is an actual mutual conductance value, and wherein the reference current-voltage slope value is a reference mutual conductance value.

6. The memory structure of claim 4, wherein the first input voltage and the second input voltage are different drain voltages, wherein the current-voltage slope value is an actual conductance value, and wherein the reference current-voltage slope value is a reference conductance value.

7. The memory structure of claim 1, wherein the memory cells in the array comprise threshold voltage-programmable field effect transistors.

8. A memory structure comprising:
an array of memory cells; and
a read circuit connected to the array and configured to detect a data storage state of any memory cell in the array based on a digital current-to-voltage slope value for the memory cell and to output a bit representative of the data storage state.

9. The memory structure of claim 8, wherein the digital current-to-voltage slope value is a mutual conductance value comprising a ratio of a difference between digital values corresponding to different output currents from the memory cell in response to different gate voltages to a difference between digital values corresponding to the different gate voltages.

10. The memory structure of claim 8, wherein the digital current-to-voltage slope value is a conductance value comprising a ratio of a difference between digital values corresponding to different output currents from the memory cell in response to different drain voltages and a difference between digital values corresponding to the different drain voltages.

11. The memory structure of claim 8, wherein the read circuit comprises:
a current sense amplifier comprising: a data input node; a reference input node; and an output node;
a column decoder connected between the array and the data input node;
a digital-to-analog converter connected to the reference input node;
a first register connected to the output node and controlled by a first clock signal;
a second register connected to the output node and controlled by a second clock signal;
a current-to-voltage slope calculator connected to the first register and the second register; and
a bit generator connected to the current-to-voltage slope calculator.

12. The memory structure of claim 11, further comprising bitlines for the columns, wherein each bitline is connected to all the memory cells in a corresponding column,
wherein the column decoder is configured to connect a bitline of the bitlines to a data line connected to the data input node for single-ended current sensing of a memory cell connected to the bitline,
wherein the digital-to-analog converter, the first register and the second register receive a series of digital-to-analog converter codes during a first single-ended current sensing process directed to the memory cell using a first input voltage and further during a second single-ended current sensing process directed to the memory cell using a second input voltage that is different from the first input voltage,
wherein, during the first single-ended current sensing process, the second clock signal is maintained at a first voltage level, the first clock signal switches from the first voltage level to a second voltage level, the digital-to-analog converter outputs a series of increasingly larger reference currents in response to the series of digital-to-analog converter codes to a reference line connected to the reference input node, the current sense amplifier compares the series of increasingly larger reference currents to a first output current on the bitline and switches the output signal at the output node from the first voltage level to the second voltage level in response to a first reference current of the series being higher than the first output current, and the first register captures and stores a first digital-to-analog converter code corresponding to the first reference current when the first clock signal and the output signal are both at the second voltage level, and wherein, during the second single-ended current sensing process, the memory cell receives a second input voltage, the first clock signal is maintained at the first voltage level, the second clock signal switches from the first voltage level to the second voltage level, the digital-to-analog converter outputs the series of increasingly larger reference currents in response to the series of digital-to-analog converter codes to the reference line, the current sense amplifier compares the series of increasingly larger reference currents to a second output current on the bitline and switches the output signal at the output node from the first voltage level to the second voltage level in response to a second reference current of the series being higher than the second output current, and the second register captures and stores a second digital-to-analog converter code corresponding to the second reference current when the second clock signal and the output signal are both at the second voltage level.

13. The memory structure of claim 12, wherein the current-to-voltage slope calculator receives the first digital-to-analog converter code from the first register, receives the second digital-to-analog converter code from the second register and calculates a current-voltage slope value as a ratio of a difference between the second digital-to-analog converter code and the first digital-to-analog converter code to a difference between a second digital value corresponding to the second input voltage and a first digital value corresponding to the first input voltage, and wherein the bit generator receives the current-voltage slope value, performs a comparison of the current-voltage slope value to a reference current-voltage slope value, and outputs a bit based on results of the comparison, wherein the bit has a first logic value when the current-voltage slope value is less than or equal to the reference current-voltage slope value and has a second logic value when the current-voltage slope value is greater than the reference current-voltage slope value.

14. The memory structure of claim 8, wherein the memory cells in the array comprise threshold voltage-programmable field effect transistors.

15. A method comprising:
providing a memory structure comprising: an array of memory cells and a read circuit connected to the array;
detecting, by the read circuit, a data storage state of any memory cell in the array based on a digital current-to-voltage slope value for the memory cell; and
outputting, by the read circuit, a bit representative of the data storage state.

16. The method of claim 15, wherein the digital current-to-voltage slope value is a mutual conductance value comprising a ratio of a difference between digital values corresponding to different output currents from the memory cell in response to different gate voltages to a difference between digital values corresponding to the different gate voltages.

17. The method of claim 15, wherein the digital current-to-voltage slope value is a conductance value comprising a ratio of a difference between digital values corresponding different output currents from the memory cell in response to different drain voltages and a difference between digital values corresponding to the different drain voltages.

18. The method of claim 17,
wherein the memory cells of the array are arranged in columns and rows,
wherein the memory structure further comprises: bitlines for the columns with all memory cells in a column connected to a bitline for the column, and wordlines for the rows with all memory cells in a row connected to a wordline for the row, and
wherein the detecting of the data storage state of a selected memory cell at a specific column and a specific row in the array comprises:
detecting a first output current on a specific bitline for the specific column in response to a first input voltage on a specific wordline for the specific row;
detecting a second output current on the specific bitline in response to a second input voltage on the specific wordline;
calculating a mutual conductance of the selected memory cell as a ratio of a difference between the second output current and the first output current to a difference between the second input voltage and the first input voltage; and
comparing the mutual conductance to a reference mutual conductance, wherein the bit has a first logic value when the mutual conductance is less than or equal to the reference mutual conductance and a second logic value when the mutual conductance is greater than the reference mutual conductance.

19. The method of claim 15, wherein the memory cells comprise threshold voltage-programmable field effect transistors.

20. The method of claim 15, wherein the memory cells comprise any of charge trap field effect transistors, floating gate field effect transistors, and ferroelectric field effect transistors.

* * * * *